(12) United States Patent
Chiba et al.

(10) Patent No.: US 7,456,552 B2
(45) Date of Patent: Nov. 25, 2008

(54) PIEZO-ELECTRIC OSCILLATOR AND METHOD OF MANUFACTURING THE SAME

(75) Inventors: Seiichi Chiba, Minowa-machi (JP); Katsuhiko Miyazaki, Minowa-machi (JP); Mutsuo Hayashi, Minowa-cho (JP)

(73) Assignee: Seiko Epson Corporation, Tokyo (JP)

( * ) Notice: Subject to any disclaimer, the term of this patent is extended or adjusted under 35 U.S.C. 154(b) by 487 days.

(21) Appl. No.: 11/056,263

(22) Filed: Feb. 14, 2005

(65) Prior Publication Data
US 2005/0184626 A1 Aug. 25, 2005

(30) Foreign Application Priority Data

| Feb. 17, 2004 | (JP) | ............................. 2004-040352 |
| Jun. 30, 2004 | (JP) | ............................. 2004-193818 |
| Jan. 12, 2005 | (JP) | ............................. 2005-005606 |

(51) Int. Cl.
*H01L 41/08* (2006.01)
(52) U.S. Cl. ........................................ 310/348; 310/348
(58) Field of Classification Search ................. 310/348, 310/344, 330, 370, 346; *H01L 41/08*
See application file for complete search history.

(56) References Cited

U.S. PATENT DOCUMENTS

| 6,545,392 B2 * | 4/2003 | Kawauchi et al. ............ 310/344 |
| 7,157,836 B2 * | 1/2007 | Kinoshita .................... 310/348 |
| 7,218,036 B2 * | 5/2007 | Shimodaira et al. ......... 310/340 |

FOREIGN PATENT DOCUMENTS

| JP | 10-98151 | 4/1998 |
| JP | 11-136034 | 5/1999 |
| JP | 2001-320240 | 11/2001 |

* cited by examiner

*Primary Examiner*—Darren Schuberg
*Assistant Examiner*—Karen B Addison
(74) *Attorney, Agent, or Firm*—Oliff & Berridge, PLC

(57) ABSTRACT

A piezo-electric oscillator has a reduced manufacturing cost using a general purpose piezo-electric vibrator, while coping with miniaturization. The piezo-electric oscillator has resin; a substrate having an upper face, a bottom face, a conductive terminal portion, and a mounting terminal portion at the bottom face; and a piezo-electric vibrator including a package, a conductive portion, a cover plate, a piezo-electric vibration piece, an external terminal portion; and an oscillation circuit element having an oscillation circuit. The piezo-electric vibration piece is housed within the package and, the package is fixed to the upper face of the substrate and sealed with the cover plate. The external terminal portion at a surface of the package is electrically coupled with the piezo-electric vibration piece and, at least the conductive portion excluding the mounting terminal portion is sealed with the resin. The oscillation circuit element is fixed to a face of the package opposite to the substrate. The conduction terminal portion on the upper face of the substrate is electrically coupled with the mounting terminal portion, and the external terminal portion and the conduction terminal portion are electrically coupled with the oscillation circuit element.

13 Claims, 22 Drawing Sheets

PIEZO-ELECTRIC OSCILLATOR AND METHOD OF MANUFACTURING THE SAME

BACKGROUND

This invention relates to a piezo-electric oscillator having a piezo-electric vibrator and an oscillation circuit element.

Piezo-electric oscillators are used widely in small information apparatuses such as a HDD (hard disk drive), a mobile computer, or an IC card, and in mobile communications apparatuses such as a portable telephone, a mobile telephone or a paging system.

A piezo-electric oscillator of the related art houses both a piezo-electric vibration piece and an oscillation circuit element in an inner space of a package. Namely, an excitation electrode is provided on the surface of the piezo-electric vibration piece. The excitation electrode is electrically coupled with an electrode film that is routed inside the package, and the electrode film is electrically coupled with the oscillation circuit element. Accordingly, the piezo-electric vibration piece and the oscillation circuit element are electrically coupled, and operation of the piezo-electric vibration piece is controlled by the oscillation circuit element.

However, in recent years, since miniaturization of the piezo-electric oscillator has been progressing spectacularly, it is difficult to house the piezo-electric vibration piece and the oscillation circuit element in the same package, as described above.

Japanese Unexamined Patent Publication No. 2001-320240 attempts to address this problem. FIG. 33 is an exploded perspective view of a piezo-electric oscillator 10 (see Japanese Unexamined Patent Publication No. 2001-320240, for example). The piezo-electric oscillator 10 has a piezo-electric vibrator 1 and an oscillation circuit element 8.

The piezo-electric vibrator 1 houses a piezo-electric vibration piece 4 in an inner space S of a package 2, which is formed by depositing a plurality of substrates made of ceramics, and is sealed with a cover plate 3. Here, an excitation electrode 5 is provided on the surface of the piezo-electric vibration piece 4. The electrode film (not shown), electrically coupled with the excitation electrode 5, is routed using the multi-layered substrates made of ceramics so as to form an electrode pad 6 in an open end face of the package 2.

Then, the oscillation circuit element 8 is mounted on the upper face of the cover plate 3 of the piezo-electric vibrator 1 so as to couple a terminal 9 of the oscillation circuit element 8 with the electrode pad 6 with a bonding wire (not shown). Moreover, the piezo-electric oscillator 10 has at a side a control terminal 7 electrically coupled with a part of the electrode pad 6 by routing the electrode film (not shown) inside the package 2. The data for controlling operation of the piezo-electric vibration piece 4 is written in the oscillation circuit element 8 through the control terminal 7.

Accordingly, because in the piezo-electric oscillator 10 it is not necessary to house the piezo-electric vibration piece 4 and the oscillation circuit element 8 together inside the narrow inner space S, manufacturing of the piezo-electric oscillator 10 will be simple even if miniaturized.

SUMMARY

However, in order to electrically couple the oscillation circuit element 8 with the piezo-electric vibration piece 4, in the piezo-electric oscillator 10 discussed above, it is necessary to route the electrode film (not shown) using the multi-layered substrate of the package 2, and to form the electrode pad 6 in the open end face of the package 2, the electrode pad 6 being coupled to the control terminal 7 at the side of the package 2.

For this reason, despite the existence of general purpose piezo-electric vibrators which are further miniaturized as compared with the piezo-electric vibrator 1, the piezo-electric vibrator 1 dedicated for the piezo-electric oscillators had to be built, thus inviting a high manufacturing cost.

The exemplary embodiments address or solve the above-described problem, and provides a piezo-electric oscillator having a reduced manufacturing cost while using a general purpose piezo-electric vibrator and while coping with the miniaturization.

The above objective is achieved, according to a first exemplary embodiment, by a piezo-electric oscillator including: a resin; a substrate having an upper face, a bottom face, a conduction terminal portion, and a mounting terminal portion at the bottom face; a piezo-electric vibrator including a package, a conductive portion, a cover plate, a piezo-electric vibration piece, and an external portion, the piezo-electric vibration piece being housed within the package that is fixed to the upper face of the substrate and sealed with the cover plate, the piezo-electric vibrator having the external terminal portion at a surface of the package being electrically coupled with the piezo-electric vibration piece; at least a conductive portion excluding a mounting terminal portion is sealed with resin; and an oscillation circuit element having an oscillation circuit, which is fixed to a face of the package opposite to the substrate, the conduction terminal portion on the upper face of the substrate being electrically coupled with the mounting terminal portion, and the external terminal portion and the conduction terminal portion being electrically coupled with the oscillation circuit element.

According to the configuration of the first exemplary embodiment, the piezo-electric oscillator includes: a piezo-electric vibrator including a package, a conductive portion, a cover plate, a piezo-electric vibration piece, and an external terminal portion, the a piezo-electric vibration piece being housed within the package, the package being sealed with a cover plate, the external terminal portion at a surface of the package being electrically coupled with the piezo-electric vibration piece; and an oscillation circuit element having an oscillation circuit which is fixed to a face opposed to a face of the package which is to be mounted at the substrate of the package. Accordingly, since it is not necessary to house the piezo-electric vibration piece and the oscillation circuit element together in the small space of the package, the manufacturing will be simple even if miniaturized.

Moreover, the mounting terminal portion is provided in the substrate, and on the upper face of the substrate, the conduction terminal portion electrically coupled with the mounting terminal portion is formed. The external terminal portion and the conduction terminal portion are electrically coupled with the oscillation circuit element. Namely, in place of the conventional mounting terminal provided in the piezo-electric vibrator, the mounting terminal portion is provided in the substrate, and the mounting terminal portion, the oscillation circuit element, and the external terminal portion can be electrically coupled at the outside of the package by forming the conduction terminal portion electrically coupled with this mounting terminal portion on the upper face of the substrate. Consequently, the mounting terminal portion, the oscillation circuit element, and the piezo-electric vibrator can be electrically coupled without routing an electrode film inside the package and without providing an electrode pad in the open end face, as in the related art.

In this way, while coping with the miniaturization, it is possible to provide the piezo-electric oscillator at a reduced or suppressed manufacturing cost using the general purpose piezo-electric vibrator.

According to a second exemplary embodiment, in the configuration of the first exemplary embodiment, the piezo-electric vibrator is fixed to the substrate such that the external terminal portion may face the upper face of the substrate, the oscillation circuit element is fixed to an upper face of the cover plate of the piezo-electric vibrator, the substrate has a connection terminal portion which is formed in a position opposed to the external terminal portion and is extended toward a periphery of the substrate from this position, and the connection terminal portion and the conduction terminal portion respectively are coupled with the oscillation circuit element by wire-bonding, respectively.

According to the configuration of the second exemplary embodiment, while the piezo-electric vibrator is fixed to the substrate so that the external terminal portion may face the upper face of the substrate, the substrate has the connection terminal portion which is formed in a position opposed to the external terminal portion, and is extended toward a periphery of the substrate from the position. For this reason, the external terminal portion of the piezo-electric vibrator is electrically coupled with the connection terminal portion in the periphery of the substrate. Then, this connection terminal portion and the conduction terminal portion coupled with the mounting terminal portion are coupled with the oscillation circuit element by wire-bonding, respectively. For this reason, the mounting terminal portion, the oscillation circuit element, and the piezo-electric vibrator can be electrically coupled without routing the electrode inside the package or without providing the electrode pad in the open end face, as in the related art.

According to a third exemplary embodiment, in the configuration of the first exemplary embodiment, the piezo-electric vibrator is fixed so that the cover plate may be opposed to the upper face of the substrate, and the oscillation circuit element is fixed to the face, in which the external terminal portion of the piezo-electric vibrator is provided, to respectively couple with the external terminal portion and the conduction terminal portion by wire-bonding.

According to the configuration of the third exemplary embodiment, the piezo-electric vibrator is fixed so that the cover plate may be opposed to the upper face of the substrate. Moreover, the oscillation circuit element is fixed to the face, in which the external terminal portion of the piezo-electric vibrator is provided. Then, the oscillation circuit element is coupled with the external terminal portion of the piezo-electric vibrator and the conduction terminal portion is electrically coupled with the mounting terminal portion by wire-bonding, respectively. For this reason, the piezo-electric vibrator and the oscillation circuit element, as well as the oscillation circuit element and the mounting terminal portion, are respectively electrically coupled. Consequently, the mounting terminal portion, the oscillation circuit element, and the piezo-electric vibrator can be electrically coupled without routing the electrode inside the package or without providing the electrode pad in the open end face.

Furthermore, in the third exemplary embodiment, because the oscillation circuit element is fixed to the face in which the external terminal portion is provided, the external terminal portion and the oscillation circuit element can be wire-bonded directly without using the connection terminal portion on the substrate which is provided in the second exemplary embodiment, and also the distance between the external terminal portion and the oscillation circuit element becomes shorter as compared with the second exemplary embodiment, thereby the floating capacitance can be reduced.

According to a fourth exemplary embodiment, in the configuration of the third exemplary embodiment, in the substrate, a hole is formed in the region opposed to the cover plate.

According to the configuration of the fourth exemplary embodiment, because a substrate has a hole formed in the region opposed to the cover plate, the cover plate is inserted in the hole of this substrate, thus enabling the height of the piezo-electric oscillator to be lowered by the amount of the thickness of the inserted cover plate.

According to a fifth exemplary embodiment, in any one of the configuration of the first to the fourth exemplary embodiment, the substrate has on the upper face thereof a control terminal portion for writing in the oscillation circuit element the signal which controls operation of the piezo-electric vibration piece, and this control terminal portion and the oscillation circuit element are coupled by wire-bonding.

According to the configuration of the fifth exemplary embodiment, because the control terminal portion for writing in the oscillation circuit element the signal to control operation of the piezo-electric vibration piece is provided in the upper face of the substrate, the electrode can be formed without routing the electrode inside the package, as in the related art, for example, without exposing to the side. Thereby, a general purpose piezo-electric vibrator can be used even for the piezo-electric oscillator having the control terminal portion.

According to a sixth exemplary embodiment, in the configuration of the fifth exemplary embodiment, a writing terminal electrically coupled with the control terminal portion is formed in the bottom face of the substrate.

According to the configuration of the sixth exemplary embodiment, because the writing terminal electrically coupled with the control terminal portion is formed in the bottom face of the substrate, it is possible to form the writing terminal widely in the bottom face in which only the mounting terminal portion is mainly provided, and which thus has some extra area. Accordingly, for example, the contact failure of the probe pin at the time of the writing can be reduced to improve the yield.

According to a seventh exemplary embodiment, in any one of the configurations of the first to the sixth exemplary embodiments, an electrode pattern is provided at the surface of the piezo-electric vibrator as well as between a terminal portion of the oscillation circuit element and the conduction terminal portion, the external terminal portion being electrically coupled with this terminal portion, and/or the conduction terminal portion on the substrate.

According to the configuration of the seventh exemplary embodiment, the electrode pattern is provided in the surface of the piezo-electric vibrator as well as between the terminal portion of the oscillation circuit element, and the external terminal portion to be electrically coupled with this terminal portion, and/or the terminals on the substrate. For this reason, even in the case where it is difficult to route the bonding wire in terms of the disposition of each terminal, the bonding wire can be routed, for example, using the electrode pattern by wire-bonding the terminal portion of the oscillation circuit element to the electrode pattern, and wire-bonding the electrode pattern to the control terminal portion. Accordingly, the routing of the bonding wire between each of the terminals becomes easy.

Note that, because the piezo-electric vibrator of the seventh exemplary embodiment has the electrode pattern provided in the surface thereof, this shape of the finished piezo-electric vibrator is not a general purpose product, strictly speaking. However, because the electrode pattern is provided in the surface of the piezo-electric vibrator, if the electrode pattern is formed afterwards in the surface of a general purpose piezo-electric vibrator, the general purpose piezo-electric vibrator can be used. Moreover, because the electrode pattern is not necessarily routed inside the package, as in the related art, even in the case where the electrode pattern is not formed afterwards in the surface of the general purpose piezo-electric vibrator, the manufacturing cost is inexpensive as compared with those of the related art, and the miniaturization can also be coped with. As a result, the same operational effects as the first to the sixth exemplary embodiments can be obtained.

According to an eighth exemplary embodiment, in the configuration of the seventh exemplary embodiment, the piezo-electric vibrator has in the surface thereof an electric conductor provided along the thickness direction, and the electrode pattern provided between the terminal portion of the oscillation circuit element and the terminal on the substrate is electrically coupled with the terminal on the substrate through this electric conductor.

According to the configuration of the eighth exemplary embodiment, the piezo-electric vibrator has in the surface thereof the electric conductor provided along the thickness direction, and the electrode pattern provided between the terminal portion of the oscillation circuit element and the terminal on the substrate is electrically coupled with the terminal on the substrate through this electric conductor. For this reason, if wire-bonding the electrode pattern to the terminal portion of the oscillation circuit element, the terminal portion of the oscillation circuit element will be electrically coupled with the terminal on the substrate through the electrode pattern as well as the electric conductor. Consequently, the space for routing the bonding wire between the piezo-electric vibrator and the substrate becomes unnecessary, and thus the piezo-electric oscillator can be miniaturized.

According to a ninth exemplary embodiment, in any one of the configurations of the first to the eighth exemplary embodiment, the region of the substrate to which the piezo-electric vibrator is fixed is in a concave shape.

According to the configuration of the ninth exemplary embodiment, the region of the substrate to which the piezo-electric vibrator is fixed is in a concave shape. For this reason, the concave shape will be a guide at the time of disposing the piezo-electric vibrator in the substrate, and thus the piezo-electric vibrator can be disposed easily.

Moreover, by forming into a concave shape the region where the piezo-electric vibrator is fixed, there will be formed a portion to be one step higher than the concave shape bottom face in the substrate. Therefore, a connection terminal portion and a conduction terminal portion, for example, can be disposed in this one step higher portion. If done this way, as compared with the other exemplary embodiments, the connection terminal portion and the conduction terminal portion will come closer to the oscillation circuit element, thus the wire-bonding can be done easily. Furthermore, the adhesive at the time of bonding the piezo-electric vibrator to the substrate can be prevented from flowing into, for example, the connection terminal portion, or the conduction terminal portion, and thus poor coupling of the wire-bonding can be prevented.

According to a tenth exemplary embodiment, in the configuration of the ninth exemplary embodiment, a part of the concave shape is formed so as not to have a step.

According to the configuration of the tenth exemplary embodiment, because a part of the concave shape is formed so as not to have a step, there will be formed in the substrate a region opened to the horizontal direction instead of being enclosed by the concave shaped inner wall. For this reason, this open region can be effectively utilized as the mounting space for each electronic component, and for example, the piezo-electric vibrator can be efficiently mounted using not only the region enclosed by the concave shaped inner wall but this open region to contribute to the miniaturization of the piezo-electric oscillator.

According to an eleventh exemplary embodiment, in either configuration of the ninth or tenth exemplary embodiment, the concave shape is formed by providing a pair of side wall portions in the substrate, and the position of the end face of the side wall portions is roughly the same in the height direction as the position of the terminal portion of the oscillation circuit element.

According to the configuration of the eleventh exemplary embodiment, because the concave shape is formed by providing a pair of side wall portions in the substrate, a part of the concave shape does not have a step, and the same operational effect as that of the tenth exemplary embodiment is exhibited.

Then, the position of the end face of the side wall portions is roughly the same in the height direction as the position of the terminal portion of the oscillation circuit element. Accordingly, if disposing, for example, the connection terminal portion and the conduction terminal portion in the end face in the height direction of the side wall portion, and then wire-bonding this terminal to the terminal portion of the oscillation circuit element, the bonding wire can be made shorter as compared with the ninth and tenth exemplary embodiments.

According to a twelfth exemplary embodiment, in any one of the configurations of the first to the eleventh exemplary embodiment, a terminal portion electrically coupled with the oscillation circuit element is provided in the surface of the substrate and/or of the piezo-electric vibrator.

According to the configuration of the twelfth exemplary embodiment, because the terminal portion electrically coupled with the oscillation circuit element is provided in the surface of the substrate and/or of the piezo-electric vibrator, if coupling an electronic component other than the oscillation circuit element to this terminal portion, this electronic component can be electrically coupled with the oscillation circuit element.

According to a thirteenth exemplary embodiment, in any one of the configurations of the first to the twelfth exemplary embodiment, a hole with a bottom is formed in a part of the mounting terminal portion.

According to the configuration of the thirteenth exemplary embodiment, because the hole with a bottom is formed in a part of the mounting terminal portion, solder or the like which couples the mounting substrate to the mounting terminal at the time of mounting the piezo-electric oscillator is adhered to the inner face of the hole with a bottom to form a fillet, which improves the joining strength.

Moreover, according to a fourteenth exemplary embodiment, the above described objective is attained by a method of manufacturing a piezo-electric oscillator having a piezo-electric vibrator which houses a piezo-electric vibration piece within a package sealed with a cover plate, and has on the surface of the package an external terminal portion electrically coupled with this piezo-electric vibration piece, and an oscillation circuit element for constituting an oscillation circuit, the method comprising: preparing a plate-shaped substrate to form a mounting terminal portion in the bottom face of the substrate, and forming in the upper face of the substrate a conduction terminal portion electrically coupled with the mounting terminal portion, and forming a connection terminal portion in the position opposed to the external terminal portion, the connection terminal portion being extended toward the periphery from this position, preparing a substrate with a size large enough to mount a plurality of the piezo-electric vibrators, as the substrate to form a mounting terminal portion, a conduction terminal portion, and a connection terminal portion corresponding to the plurality of the piezo-electric oscillators; coupling the piezo-electric vibrator to the upper face of the substrate; an element fixing process for couple-fixing the oscillation circuit element to the cover plate; respectively coupling the oscillation circuit element with the conduction terminal portion as well as the connection terminal portion by wire-bonding; and a sealing, with resin, at least a conductive portion excluding the mounting terminal portion and cutting the oscillators into each of the plurality of piezo-electric oscillators after coupling the piezo-electric vibrator, fixing the oscillation circuit element, respectively coupling the oscillation circuit element, and sealing.

According to the configuration of the fourteenth exemplary embodiment, there are provided: preparing a plate-shaped substrate to form a mounting terminal portion in the bottom face of the substrate, and forming in the upper face of the substrate a conduction terminal portion electrically coupled with the mounting terminal portion, and forming a connection terminal portion in the position opposed to the external terminal portion, the connection terminal portion being extended toward the periphery from this position; coupling the piezo-electric vibrator to the upper face of the substrate; couple-fixing the oscillation circuit element to the cover plate; respectively wire-bonding the oscillation circuit element with the conduction terminal portion and the connection terminal portion, respectively.

Accordingly, it is not necessary to house the piezo-electric vibration piece and the oscillation circuit element together in the small space of the package, and thus the manufacturing will be simplified even if miniaturized. Furthermore, without routing the electrode inside the package or without providing the electrode pad in the open end face, as in the related art, the mounting terminal portion, the oscillation circuit element, and the external terminal portion can be electrically coupled to form the piezo-electric oscillator using a general purpose piezo-electric vibrator.

Then, a substrate with a size large enough to mount a plurality of the piezo-electric vibrators is prepared as the substrate to form a mounting terminal portion, a conduction terminal portion, and a connection terminal portion corresponding to the plurality of the piezo-electric oscillators, and cutting the oscillators into each of the plurality of piezo-electric oscillators after coupling the piezo-electric vibrator, fixing the oscillation circuit element, respectively coupling the oscillation circuit element, and sealing. Therefore, a plurality of piezo-electric oscillators can be manufactured in one manufacturing process.

Moreover, according to a fifteenth exemplary embodiment, the above described objective is attained by a method of manufacturing a piezo-electric oscillator having a piezo-electric vibrator which houses a piezo-electric vibration piece within a package sealed with a cover plate, and has on the surface of the package an external terminal portion electrically coupled with this piezo-electric vibration piece, and an oscillation circuit element for constituting an oscillation circuit, the method comprising: preparing a plate-shaped substrate to form a mounting terminal portion in the bottom face of this substrate, and forming in the upper face of the substrate a conduction terminal portion electrically coupled with the mounting terminal portion, preparing a substrate with a size large enough to mount a plurality of the piezo-electric vibrators as the substrate to form a mounting terminal portion and a conduction terminal portion corresponding to the plurality of the piezo-electric oscillators; coupling the piezo-electric vibrator so that the cover plate may be opposed to the upper face of the substrate; fixing the oscillation circuit element to the face of the package in which the external terminal portion is provided; respectively coupling the oscillation circuit element with the conduction terminal portion as well as the external terminal portion by wire-bonding, and sealing with resin, at least a conductive portion excluding the mounting terminal portion; cutting the oscillators into each of the plurality of piezo-electric oscillators after coupling the piezo-electric vibrator, fixing the oscillation circuit element, respectively coupling the oscillation circuit element, and sealing.

According to the configuration of the fifteenth exemplary embodiment, there are provided preparing a plate-shaped substrate to form a mounting terminal portion in the bottom face of this substrate, and forming in the upper face of the substrate the conduction terminal portion electrically coupled with the mounting terminal portion; the mounting process for coupling the piezo-electric vibrator so that the cover plate may be opposed to the upper face of the substrate; fixing the oscillation circuit element to the face of the package in which the external terminal portion is provided; respectively coupling the oscillation circuit element with the conduction terminal portion as well as the external terminal portion by wire-bonding, for sealing with resin, at least a conductive portion excluding the mounting terminal portion.

For this reason, it is not necessary to house the piezo-electric vibration piece and the oscillation circuit element together in the small space of the package like the fourteenth exemplary embodiment, and thus the manufacturing can be simplified even if miniaturized. Moreover, like the fourteenth exemplary embodiment, without routing the electrode inside the package or without providing the electrode pad in the open end face, the mounting terminal portion, the oscillation circuit element, and the external terminal portion can be electrically coupled to form the piezo-electric oscillator using a general purpose piezo-electric vibrator.

Furthermore, because the oscillation circuit element can be fixed to the face, in which the external terminal portion of the package is provided, by fixing the piezo-electric vibrator so that the cover plate may face to the substrate, the external terminal portion can be wire-bonded to the oscillation circuit element without providing the connection terminal portion in the substrate.

Moreover, because the external terminal portion and the oscillation circuit element are provided in the same face of the package, the distance between the external terminal portion and the oscillation circuit element becomes shorter as compared with the fourteenth exemplary embodiment, and thus the floating capacitance also can be made smaller.

Then, a substrate with a size large enough to mount a plurality of the piezo-electric vibrators is prepared as the substrate to form a mounting terminal portion and a conduction terminal portion corresponding to the plurality of the piezo-electric oscillators, and cutting the oscillators into each of the plurality of piezo-electric oscillators after coupling the piezo-electric vibrator, fixing the oscillation circuit element, respectively coupling the oscillation circuit element, and sealing. Therefore, a plurality of piezo-electric oscillators can be manufactured in one manufacturing process.

According to a sixteenth exemplary embodiment, in either one of the configuration of the fourteenth or fifteenth exemplary embodiments, a through-hole is formed in the substrate, an electrically conductive member is filled in this through-hole to electrically couple the mounting terminal portion with the conduction terminal portion through this electrically conductive member.

According to the configuration of the sixteenth exemplary embodiment, a through-hole is formed in the substrate, an electrically conductive member is filled in this through-hole to electrically couple the mounting terminal portion with the conduction terminal portion through this electrically conductive member. For this reason, in the sealing process after the substrate formation process, for example, when injecting resin into the cavity of a metal mold, the through-hole for electrically coupling the mounting terminal portion with the conduction terminal portion is in a condition being covered with the electrically conductive member that is filled therein. Therefore, the resin can be prevented from passing through the through-hole to flow out to unwished positions.

DETAILED DESCRIPTION OF EMBODIMENTS

Figure 1:
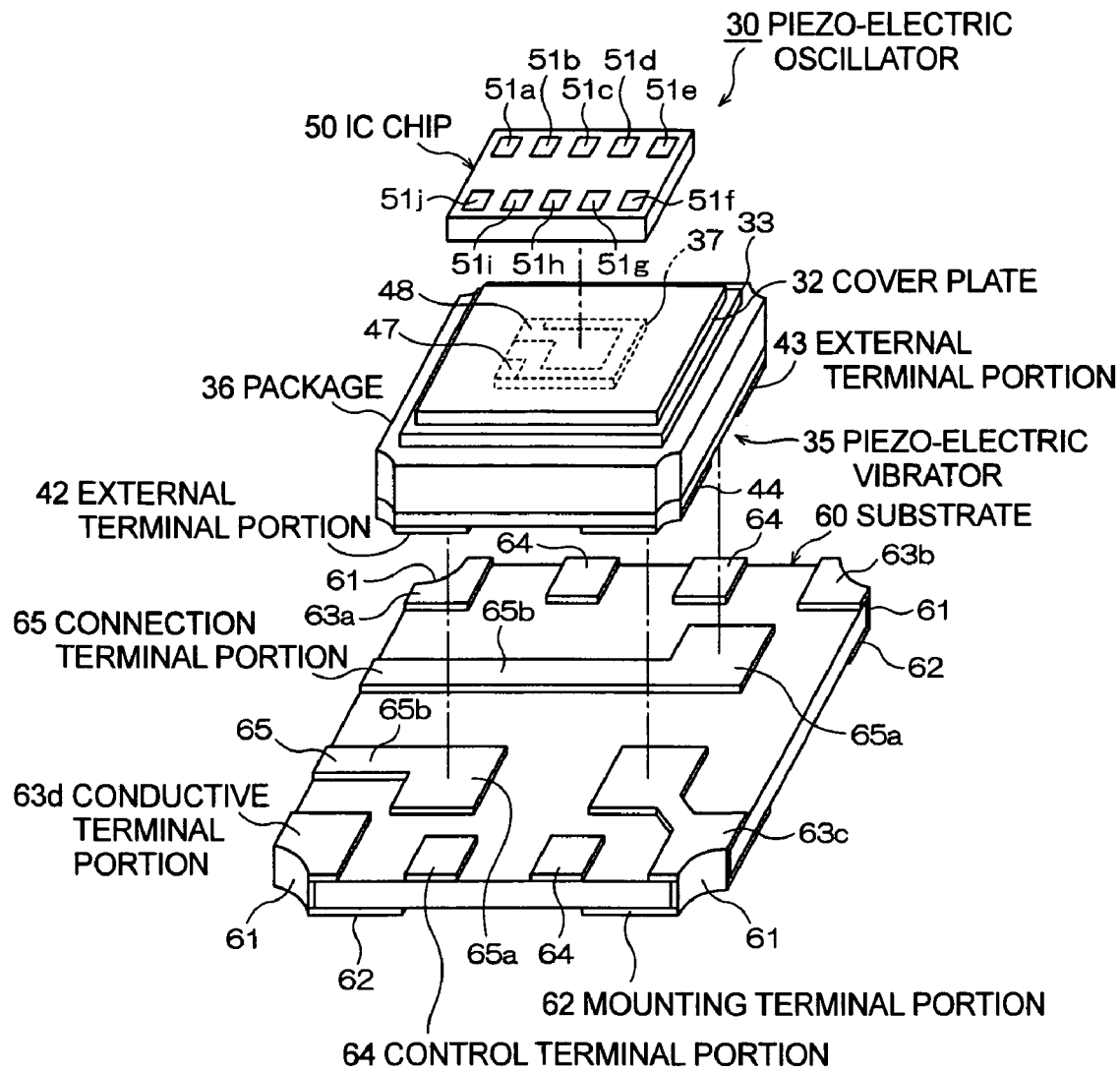
FIG. 1 is a schematic exploded perspective view concerning a first embodiment of a piezo-electric oscillator in an exemplary embodiment of the present invention.
Figure 2:
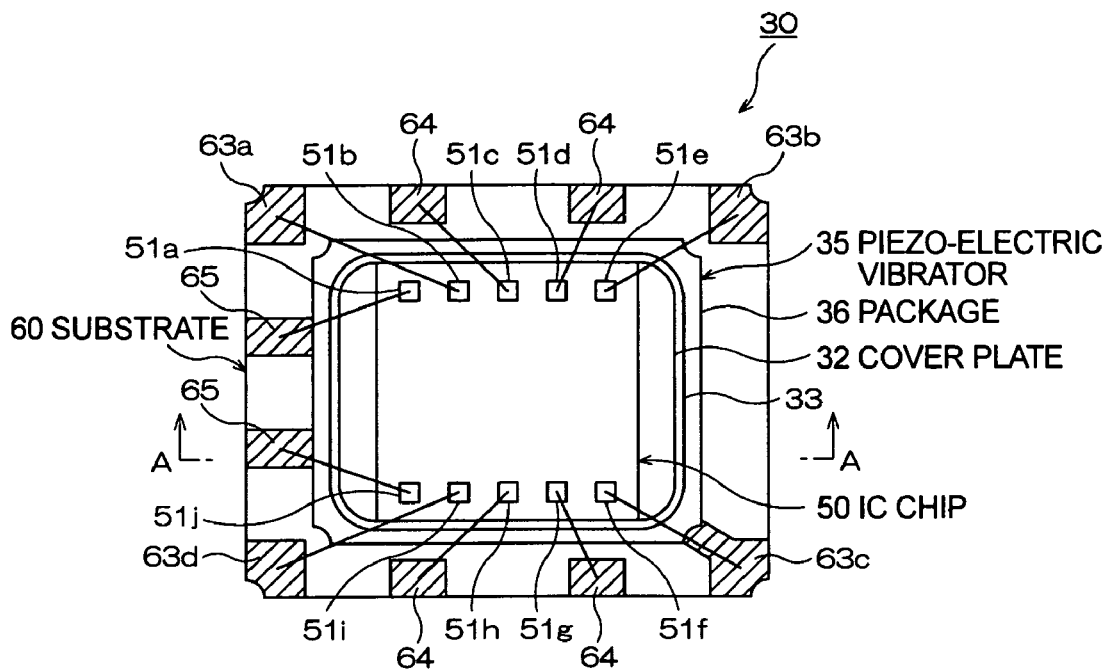
FIG. 2 is a schematic plane view concerning the first embodiment of the piezo-electric oscillator in an exemplary embodiment of the present invention.
Figure 3:
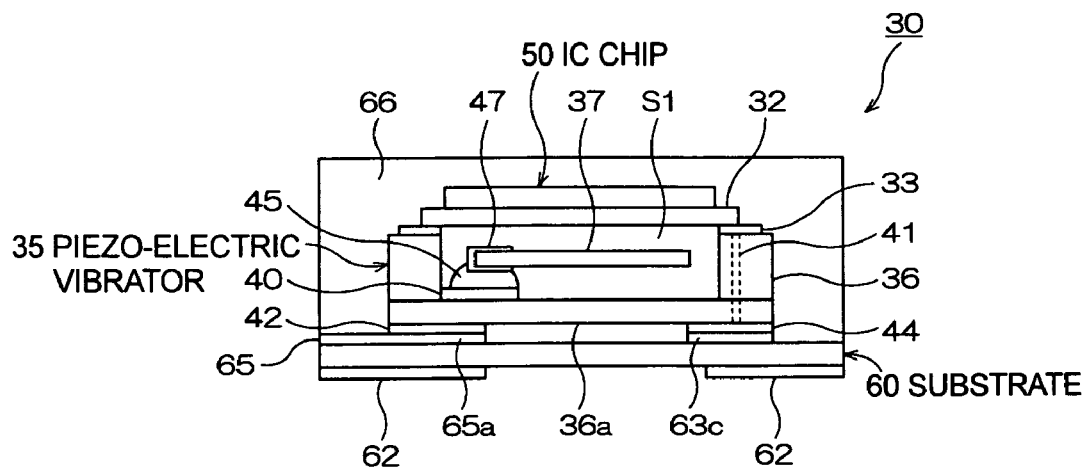
FIG. 3 is a schematic cross-sectional view cut along the A-A line of FIG. 2.

FIG. 1 to FIG. 3 illustrate a first exemplary embodiment of the piezo-electric oscillator according to the present invention. FIG. 1 is a schematic exploded perspective view of the piezo-electric oscillator, FIG. 2 is a schematic plane view of the piezo-electric oscillator, and FIG. 3 is a schematic cross-sectional view taken along line A-A of FIG. 2. To more clearly illustrate the features of FIGS. 1-3, a resin mold portion to be described hereinafter is not shown in FIG. 1 and FIG. 2, and a bonding wire is not shown in FIG. 1 and FIG. 3.

According to FIGS. 1-3, a piezo-electric oscillator 30 includes a piezo-electric vibrator 35 which houses a piezo-electric vibration piece 37, and an IC chip 50, as an oscillation circuit element for constituting an oscillation circuit. The IC chip 50, for example, is a semiconductor element.

A general purpose product is used for the piezo-electric vibrator 35, and the piezo-electric vibrator 35, of the so-called surface mounting type, which houses the piezo-electric vibration piece 37 within a package 36 sealed with a cover plate 32, is used.

After depositing a plurality of substrates which are formed molding (for example, a ceramic green sheet of aluminum oxide characteristic, as an insulating material) the package 36 is formed by sintering as shown in FIG. 1 and FIG. 3, and a part of the substrates have, by forming a predetermined hole inside when depositing the plurality of substrates, a predetermined inner space S1, which may be formed in the shape of a rectangular box with an opening.

This inner space S1 is the space for housing the piezo-electric vibration piece 37.

As shown in FIG. 3, near a left end portion of a bottom portion of an inner side of the package 36, an electrode portion 40 formed, for example, by nickel plating and gold plating on the metalized tungsten so as to be exposed to the inner space S1. The electrode portion 40 (although not shown in FIG. 2) is formed in the same configuration near both ends in the width direction (in the top and bottom direction) of the package 36 in FIG. 2, respectively.

The electrode portion 40 of FIG. 3 is routed inside the package 36 to couple with an external terminal portion 42 provided on a bottom face 36a of the package 36, as shown in FIG. 1 and FIG. 3. In the same way, the other electrode portion (not shown) described above is coupled with an external terminal portion 43 shown in FIG. 1 which is provided on the bottom face 36a of the package 36.

The electrode portion 40 and the other electrode portion (not shown) are electrically coupled with the IC chip 50 to supply a driving voltage to the piezo-electric vibration piece 37, as will be described hereinafter. Namely, as shown in FIG. 3, an electrically conductive adhesive 45 is applied to the surface of the electrode portion 40, and then a lead electrode portion 47 provided on the surface of the piezo-electric vibration piece 37 is installed onto the electrically conductive adhesive 45 to join the lead electrode portion 47 to the electric portion 40 by hardening of the electrically conductive adhesive 45. In addition, the electrically conductive adhesive is also applied to the other electrode portion, which is not shown in FIG. 3, to join the other electrode portion to a lead electrode portion 48 (refer to FIG. 1) used for the driving of the piezo-electric vibration piece 37.

In addition, as the electrically conductive adhesive 45 causes a synthetic resin agent as an adhesive component exhibiting a power to join or attach, the electrically conductive adhesive 45 may contain electrically conductive particles, such as fine particles made of silver. The electrically conductive adhesive 45 can be utilized in a silicone system, an epoxy system, or a polyimide system.

The piezo-electric vibration piece 37 may be made of quartz, for example, and piezo-electric material other than the quartz, such as tantalum acid lithium and niobium acid lithium can be used. For example, a so-called AT cut vibration piece which is made by cutting a quartz wafer along a predetermined direction into a rectangular shape, and a vibration piece of a tuning fork type can be used. In an exemplary embodiment, an AT cut vibration piece in which there is provided on the surface thereof an excitation electrode as the driving electrode, and the above described lead electrodes 47 and 48, which are coupled with this excitation electrode and formed by drawing out to the joined end of the piezo-electric vibration piece 37, are used as the piezo-electric vibration piece 37, as shown in FIG. 1.

In an exemplary embodiment the cover plate 32, in a plate-shape, is used for hermetically sealing the piezo-electric vibration piece 37 within the inner space S1. The cover plate 32 is sealed using a solder material to fix to the open end of the package 36.

In this exemplary embodiment, as for the cover plate 32, a conductor metal, such as an alloy of Fe-nickel-Co in a metal system is used to join the package 36 with a seal ring 33, as shown in FIGS. 1-3. Then, the conductor is coupled through an electric conductive portion 41 with a dummy terminal portion 44 which is formed exposed to a bottom face 36a of the package 36, while not electrically coupled to the piezo-electric vibration piece 37. Then, in this exemplary embodiment, by grounding the cover plate 32 using the dummy terminal portion 44 according to the structure described hereinafter, the influence of noises received from a mother board, or the like, is suppressed.

Then, the IC chip 50, as the oscillation circuit element, contains an oscillation circuit formed with an integrated circuit (not shown) therein. This IC chip 50 is fixed to a face different from a face in which the external terminal portions 42 and 43 of the package 36 are provided. In this exemplary embodiment, the IC chip 50 is fixed to an upper face and near a center of the cover plate 32, which exists in the face opposed to the face in which the external terminal portions 42 and 43 are provided, by using, for example, adhesive in an epoxy system or a silicone system.

Figure 10:
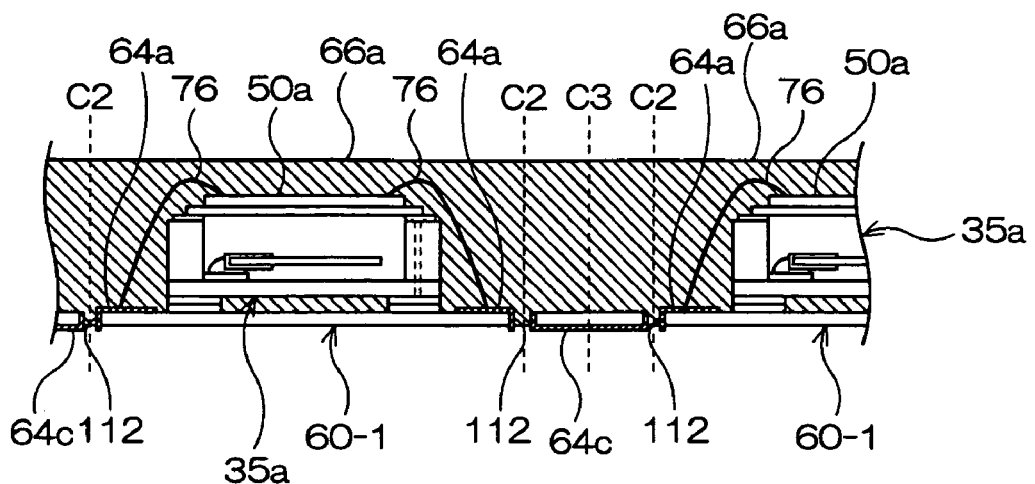
FIG. 10 is a schematic cross-sectional view of the piezo-electric vibrator having the IC chip mounted thereon installed on a substrate to resin-mold and cut in the position of line J-J of FIG. 9A in an exemplary embodiment of the present invention.

Some terminal portions are provided in the face opposed to the joined face of the cover plate 32 and the IC chip 50. In FIG. 1 and FIG. 2, 10 terminal portions including terminal portions 51a to 51j are exposed along a periphery of the IC chip 50. A count of the terminal portions of the IC chip 50 may be more or less than 10 depending on the type of the IC chip used. For example, in this exemplary embodiment, the terminal portions 51a and 51j of the IC chip 50 are the terminals used for coupling with the piezo-electric vibrator 35, as described hereinafter. The terminal portions 51b, 51e, and 51i are the input/output terminals of the oscillation circuit coupled with the mounting terminal portion, as described hereinafter. The terminal portions 51c, 51d, 51g, and 51h are the terminals for writing data in the oscillation circuit. The terminal portion 51f is the ground terminal.

Here, the piezo-electric vibrator 35 in which the IC chip 50 is mounted is fixed so that the bottom face 36a having the external terminal portions 42 and 43, as well as the dummy terminal portion 44, may face almost a center on an upper face of the substrate 60, as shown in FIG. 1 to FIG. 3.

The substrate 60 is used for electrically coupling a mounting terminal portion 62 for mounting the piezo-electric oscillator 30 in a mother board, the IC chip 50, and the piezo-electric vibrator 35. The substrate 60 is a flat plate wherein, for example, an electrode pattern formed by nickel and gold plating is printed on the metalized tungsten.

The substrate 60 is made by forming insulating material, such as ceramics and an epoxy resin into a plate shape slightly larger than the outline of the piezo-electric vibrator 35. As shown in FIG. 1, castellation portions 61 which are quarter-round shaped in a plan view are provided in four corners. These castellation portions 61, when manufacturing the substrate 60, are formed, as will be describe hereinafter, based on circular shaped through-holes and via holes to be used as a guide formed in a crossing point of cutting lines at the time of cutting the substrate, the substrate being large enough to fix a plurality of piezo-electric vibrators into a size corresponding to each piezo-electric oscillator.

Moreover, the substrate 60 has mounting terminal portions 62 near each of the four corners on a bottom face of the substrate 60 (note that one terminal portion among the four corners is not shown in FIG. 1). The mounting terminal portions 62 near each of the four corners are electrically coupled with the conduction terminal portions 63a, 63b, 63c, and 63d provided near each of the four corners in a periphery of an upper face of the substrate 60, through the electric conduction pattern provided on the surface of the castellation portion 61, at the four corners, respectively.

Then, the conduction terminal portion 63a is wire-bonded to the terminal portion 51b of the IC chip 50 described above, the conduction terminal portion 63b is wire-bonded to the terminal portion 51e, the conduction terminal portion 63c is wire-bonded to the terminal portion 51f, and the conduction terminal portion 63d is wire-bonded to the terminal portion 51j with a gold wire or the like, respectively.

In addition, as shown in FIG. 1, the conduction terminal portion 63c is routed in the upper face of the substrate 60 to extend to a place opposed to the dummy terminal portion 44 when installing the piezo-electric vibrator 35, thereby enabling the cover plate 32 to be grounded.

Moreover, in the upper face thereof and in the periphery region where the piezo-electric vibrator 35 is not placed, the substrate 60 has a plurality of control terminal portions 64 for writing into the IC chip 50 a signal to control operation of the piezo-electric vibration piece 37. Namely, the plurality of control terminal portions 64 are wire-bonded to the terminal portions 51c, 51d, 51g, and 51h of the IC chip 50 with a gold wire or the like, respectively, so as to be conductive. In the control terminal portion 64 in this exemplary embodiment, temperature compensation data is written into the IC chip 50 to make a temperature compensation correspond to the characteristics of the piezo-electric vibration piece 37.

Then, the substrate 60 has connection terminal portions 65 formed in the upper face thereof. These connection terminal portions 65 and 65 are the terminals for electrically coupling the piezo-electric vibrator 35 with the IC chip 50. Namely, as shown in FIG. 1, the connection terminal portions 65 and 65 have portions 65a and 65a formed in the position opposed to the external terminal portions 42 and 43 which are electrically coupled with the piezo-electric vibration piece 37, and at the same time the connection terminal portions 65 each have the portion 65b and 65b which are extended toward the periphery from the positions of 65a and 65a. The portions of 65b and 65b are the extension portions for exposing the portions of 65a and 65a, which will extend behind the bottom of the package 36 when fixing the piezo-electric vibrator 35 to the substrate 60, to the outside, from the side of the package 36, and these portions of 65b are respectively wire-bonded to the terminal portions 51a and 51j of the IC chip 50 with a gold wire or the like.

Then, as shown in FIG. 3, in the piezo-electric oscillator 30, at least conductive portions are sealed with resin 66, excluding the mounting terminal portions 62, provided in the four corners on the bottom face of the substrate 60. Namely, the resin 66 insulates each terminal and the gold wire, or the like, of the wire-bonding, which are electrically conductive portions. In this exemplary embodiment, in order to insulate the conductive portions and to protect the inner structure, the piezo-electric vibrator 35 is sealed with the resin 66 so that the bottom face of the substrate 60 may be exposed. Moreover, the resin 66 is formed by injecting, for example, an epoxy system resin, as a synthetic resin excellent in molding characteristics and insulating characteristics, into a molding tool to mold, as shown in FIG. 3.

This exemplary embodiment is constituted as described above, and a method of manufacturing the piezo-electric oscillator 30 will be described next.

Figure 4:
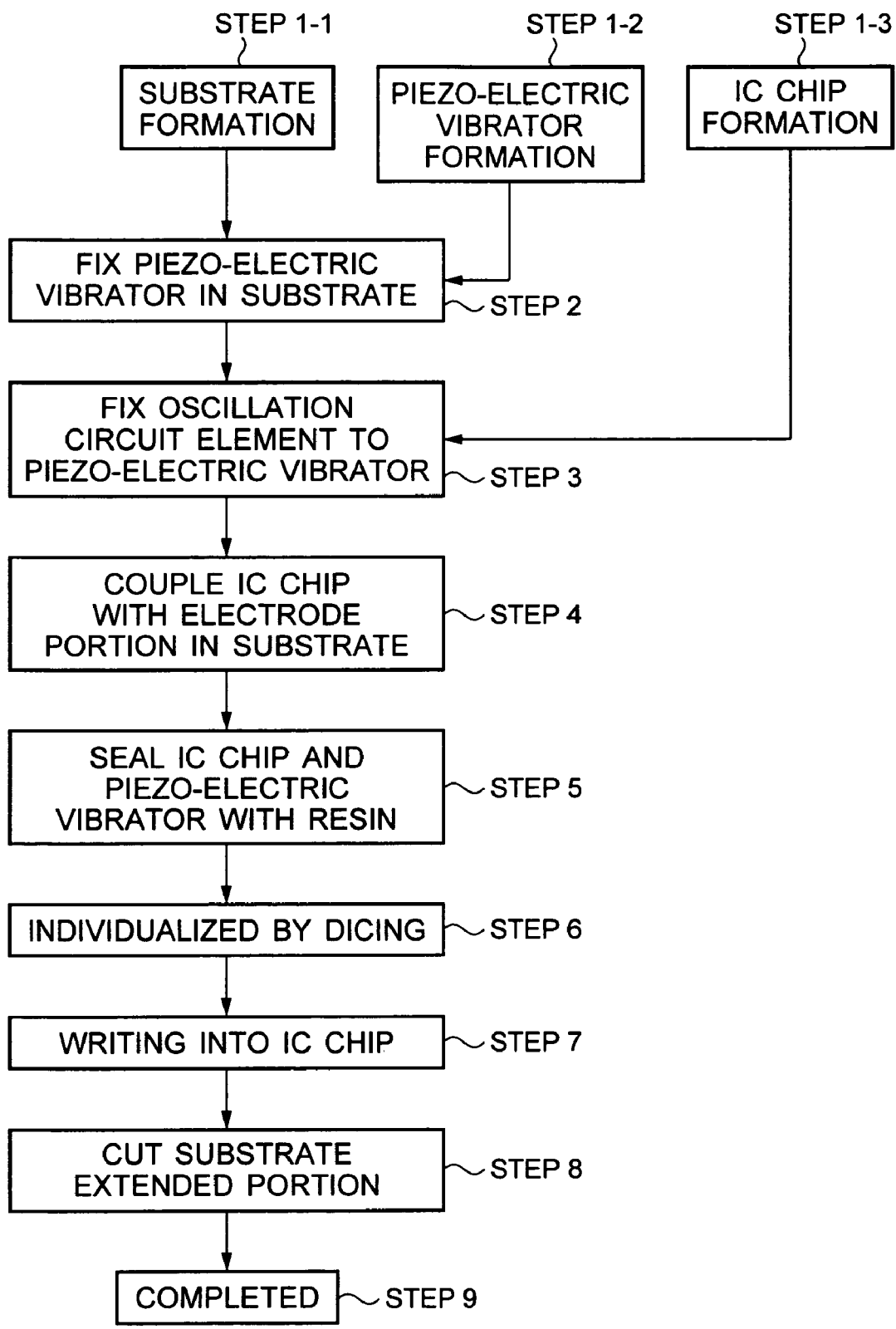
FIG. 4 is a flow chart illustrating a manufacturing process for a piezo-electric oscillator in the first exemplary embodiment of the present invention.

FIG. 4 is a flow chart illustrating briefly an example of the manufacturing process for the piezo-electric oscillator 30.

First, a piezo-electric vibrator, an IC chip, and a substrate in which the piezo-electric vibrator is to be mounted are prepared individually.

As for the piezo-electric vibrator, a plurality of general purpose piezo-electric vibrators are prepared. Specifically, a plurality of piezo-electric vibrators are prepared which are the same as the so-called surface mounting type piezo-electric vibrators 35 described in detail in FIG. 1 to FIG. 3. The plurality of piezo-electric vibrators are sealed hermetically with the cover plate 32 after forming the external terminal portions 42 and 43 in the surface of the package, for example, made of ceramics, and joining the piezo-electric vibration piece 37, which went through the necessary inspection in relation to the oscillation frequency thereof, or the like (See Step 1-2).

The IC chip is a semiconductor element with a built-in oscillation circuit, and is not limited to predetermined types commercially available, but may be the types that are manufactured by order. In this exemplary embodiment, the type already described in FIG. 1 to FIG. 3 is prepared (See Step 1-3).

Figure 5:
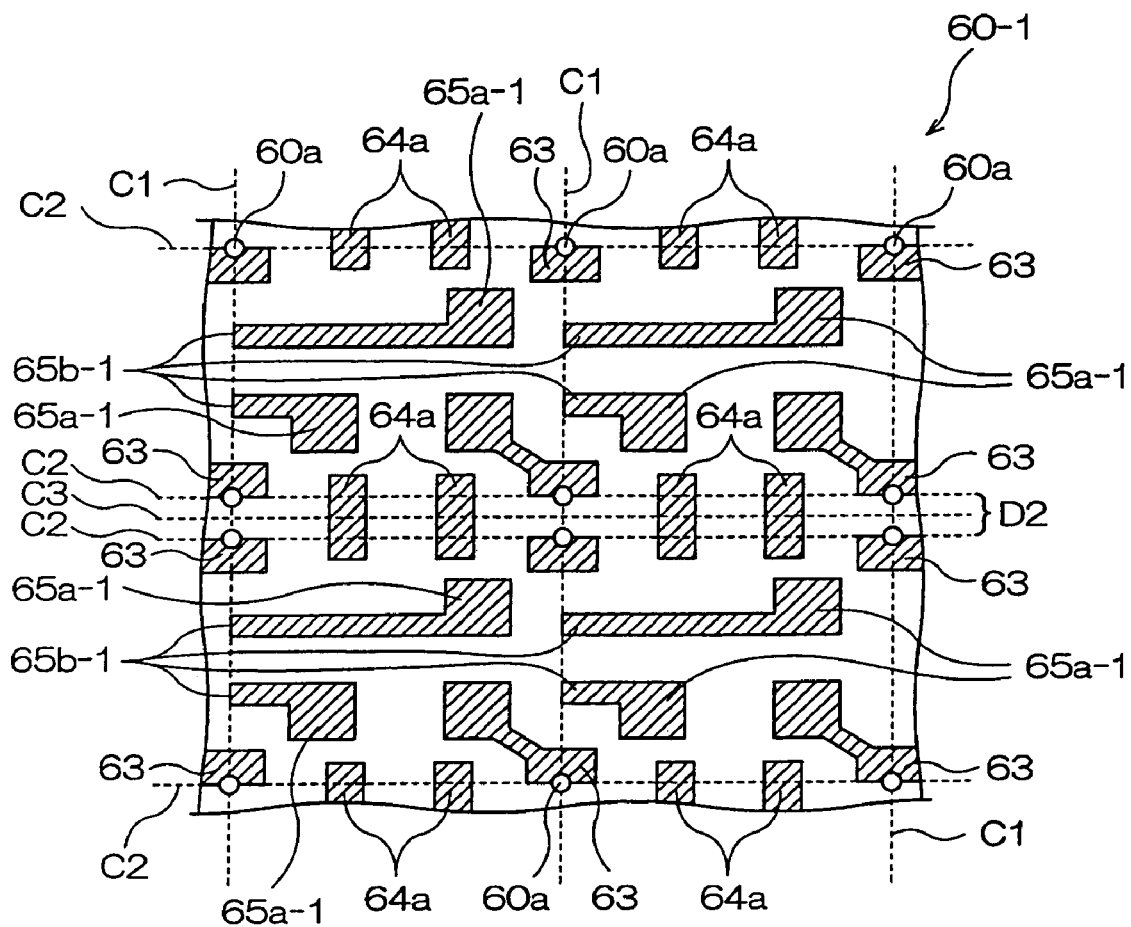
FIG. 5 is a schematic illustrating step 1-1 of FIG. 4.

Then, with respect to the substrate, as shown in FIG. 5, a substrate 60-1 of a plate shape large enough to mount a plurality of piezo-electric vibrators is prepared. An electrode pattern corresponding to the plurality of piezo-electric vibrators to be mounted in this substrate 60-1 is formed (See step S1-1: a substrate formation process).

Insulating material, such as ceramics and an epoxy resin, is molded in a size for fixing the plurality of piezo-electric vibrators, and through-holes including penetrating holes (hereinafter, referred to as a "through-hole") 60a, 60a, 60a and so on, are formed at crossing points of vertical cutting lines C1, C1 and so on, and horizontal cutting line C2, C2 and so on, when cutting into a size corresponding to each piezo-electric oscillator in a cutting process (see step 6 and step 8, which will be described hereinafter).

In addition, with respect to the substrate 60-1, a cutoff region D2, which is to be cut off after completion, is provided between the region corresponding to the finished substrate 60 (refer to FIG. 1), and the region corresponding to the finished substrate 60 next to this region, as well as at the side in which the control terminal portion 64 is formed. This cutoff region D2, as will be described later, is the region where the electrode coupled with the electrode corresponding to the control terminal portion 64 after completion is formed, and is the region enabling data to be written into the IC chip even after the sealing of the resin.

Then, an electrode pattern is, for example, metalize-printed in the substrate 60-1, corresponding to each position in which the plurality of piezo-electric vibrators is to be mounted.

Specifically, at a bottom face (the back face of FIG. 5) of the substrate 60-1, in a peripheral of each through-hole 60a, excluding the cutoff region D2, as well as along the circular arc of each through-hole 60a, the electrode pattern (not shown) corresponding to the finished mounting terminal portion 62 (refer to FIG. 1) is formed. Moreover, with respect to an upper face (the surface of FIG. 5) of the substrate 60-1, in the peripheral of each through-hole 60a, except the cutoff region D2, as well as along the circular arc of each through-hole 60a, the electrode pattern 63 corresponding to the finished conduction terminal portions 63a, 63b, 63c and 63d is formed.

At this time, in order to couple the electrode pattern (not shown) around each through-hole 60a on the bottom face of the substrate 60-1, with each electrode pattern 63 on the upper face of the substrate 60-1, respectively, the electric conduction pattern in the surface of the castellation portion 61 shown in FIG. 1 is formed. This electric conduction pattern is formed, for example, by applying electric conduction paste to close the opening portion of the through-hole 60a, and sucking the inside of the through-hole from the bottom face side of the substrate, thus applying and drying this electric conduction paste to the inner wall of the through-hole 60a.

Moreover, with respect to the upper face of the substrate 60-1, the electrode patterns 64a, 64a and so on are formed in regions other than the region where the piezo-electric vibrator is to be mounted so as to cross the cutoff region D2. Among these electrode patterns 64a, 64a and so on, the portion disposed in the region other than the cutoff region D2 become each control terminal portion 64 after completion.

Moreover, when mounting a plurality of piezo-electric vibrators in the upper face of the substrate 60-1, the electrode patterns 65a-1, 65a-1 and so on are formed in the position opposed to each of the external terminal portions (terminals with numerals 42 and 43 shown in FIG. 1) of a plurality of piezo-electric vibrators, and at the same time electrode pattern 65b-1, 65b-1 and so on, which are extended to regions other than the region, in which the piezo-electric vibrator is to be mounted, from the position of these electrode patterns 65a-1, 65a-1, and so on, are formed. These electrode patterns 65a-1 and so on, as well as 65b-1 and so on, become the connection terminal portion 65 after completion.

Next, the following processes will be carried out corresponding to the plurality of piezo-electric oscillators.

Figure 6:
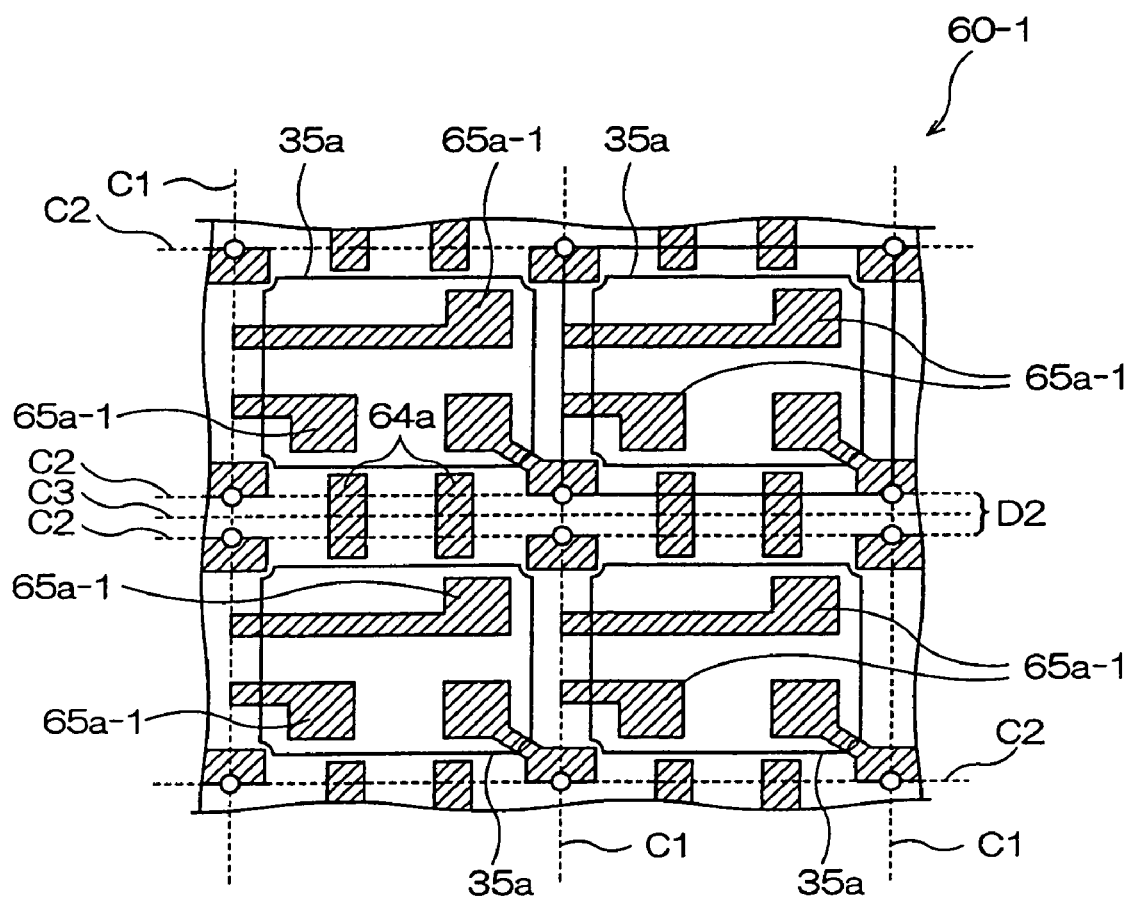
FIG. 6 is a schematic illustration step 2 of FIG. 4.

First, as shown in FIG. 6, a plurality of general purpose piezo-electric vibrators 35a, 35a and so on, prepared at step 1-2, are bonded to the upper face of the substrate 60-1. In addition, in FIG. 6, only the outline of the piezo-electric vibrator 35a is shown for convenience of understanding. Namely, the external terminal portions (terminals with numerals 42 and 43 shown in FIG. 1) of the plurality of piezo-electric vibrators 35a are bonded so as to be opposed to each of the electrode patterns, 65a-1, 65a-1 and so on, provided in the upper face of the substrate 60-1 (Step 2: a mounting process).

Then, the IC chip prepared at step 1-3 is couple-fixed to the upper face of the cover plate (refer to the numeral 32 of FIG. 1 to FIG. 3) of each piezo-electric vibrator 35a using adhesive of an epoxy system or a silicone system (Step 3: an element fixing process), and as shown in FIG. 3. The plurality of IC chips are respectively wire-bonded to the plurality of electrode patterns 65b-1, 64a and 63 on the substrate 60-1, with a gold wire or the like. (Step 4: a bonding process).

Figure 7:
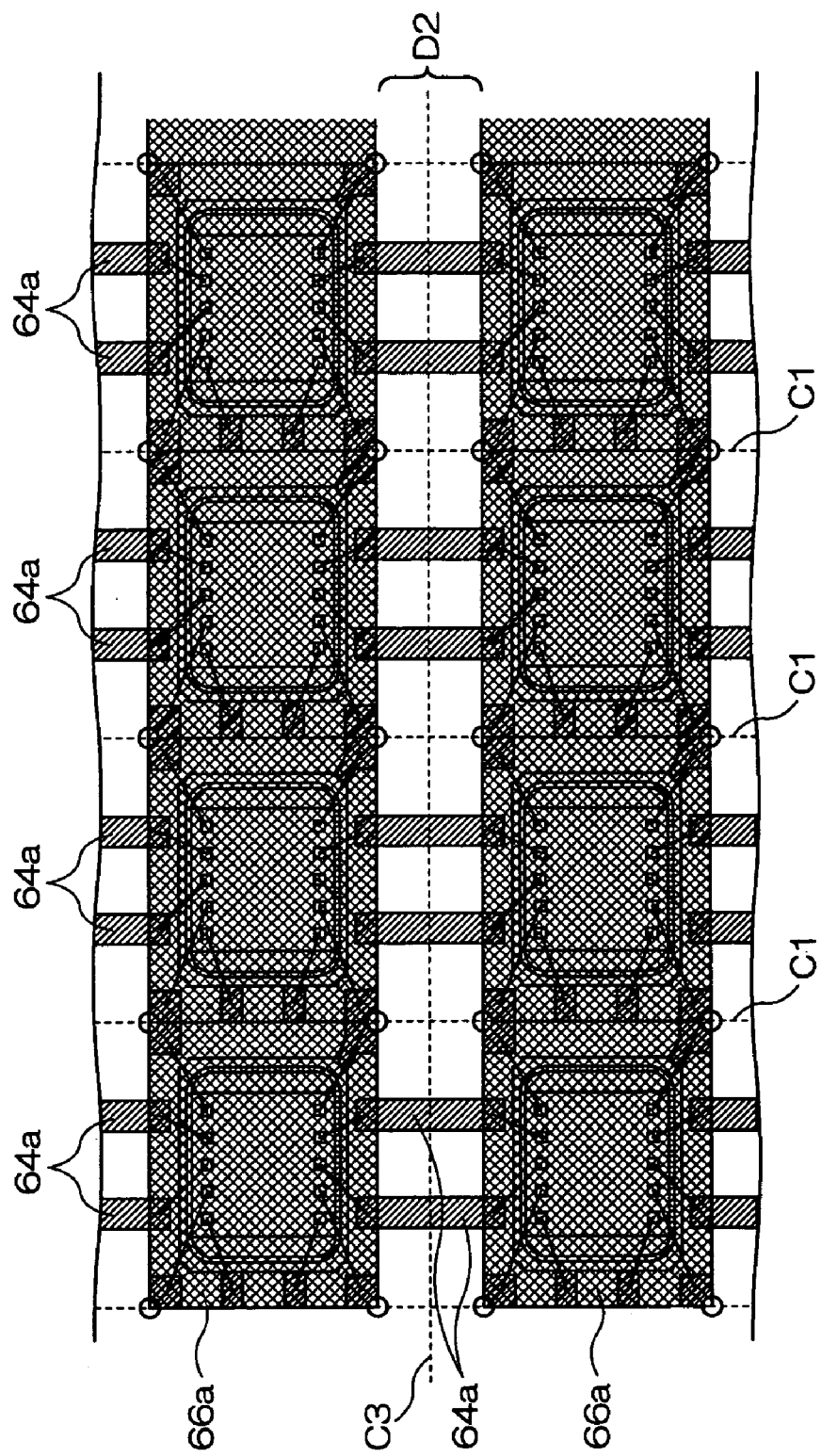
FIG. 7 is a schematic illustrating step 5 and step 6 of FIG. 4.

Then, as shown in FIG. 7, for the purpose of protection against the bonding wire, or the like, and of isolation between each of the electrode patterns, or the like, an epoxy system synthetic resin 66a, for example, is injected into a molding tool to seal the IC chip and piezo-electric vibrator (Step 5: a sealing process). At this point, the resin 66a is not applied to the cutoff region D2 formed between the adjacent substrate 60 (refer to FIG. 1) and substrate 60 after completion, in this sealing process. Moreover, at least the electrode pattern which serves as the mounting terminal portion after completion must not be sealed with the resin 66a. In addition, as long as the protection and the insulating effect for each component described above can be obtained, the whole bottom face of the substrate 60-1 may be exposed to the outside, for example, like in this exemplary embodiment.

Next, each electrode pattern 64a formed as to cross the cutoff region D2 formed between the adjacent substrate 60 (refer to FIG. 1) and substrate 60 after completion, is cut off together with the substrate 60-1 along the cutting line C3 shown in FIG. 7. In addition, in this case, the substrate 60-1 is cut off along the vertical cutting lines, C1, C1 and so on, to roughly individualize each piezo-electric oscillator (Step 6).

Then, by applying a probe to the electrode pattern 64a which is not resin-sealed and is exposed to the outside, data used for temperature compensation is written into the IC chip to make the temperature compensation correspond to the characteristic of the piezo-electric vibrator (Step 7). Here, because the characteristics of the piezo-electric vibration piece differs for each piezo-electric vibrator to manufacture, the data used for temperature compensation differs for each piezo-electric oscillator to manufacture. However, because the substrate 60-1 is already individualized at the above-described step 6, the characteristic for each piezo-electric vibrator can be determined to make the temperature compensation corresponding to the characteristic of each piezo-electric vibrator.

Then, the shape of the piezo-electric oscillator is adjusted by cutting the substrate 60-1 along the horizontal cutting lines, C2, C2 and so on, shown in FIG. 6 (Step 8), and the inspection is made to bring to completion.

Figure 8:
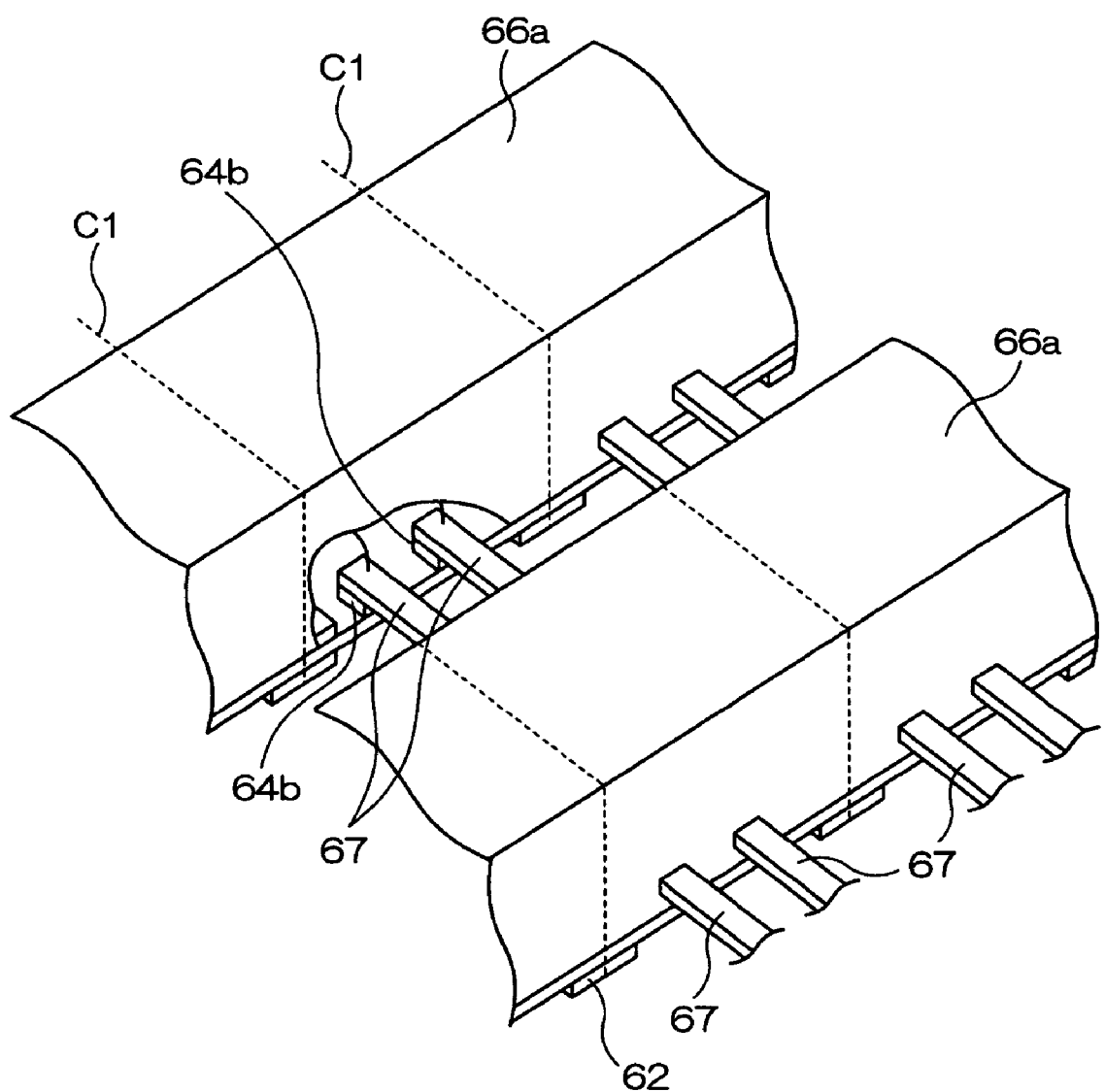
FIG. 8 is a schematic illustrating a manufacturing method of the piezo-electric oscillator in the first exemplary embodiment of the present invention.

In addition, in the manufacturing method shown in FIG. 4 to FIG. 7, one substrate 60-1 having a size large enough to install the plurality of piezo-electric vibrators 35 in order in the vertical and horizontal directions is prepared to manufacture the piezo-electric oscillator 30. For example, as shown in FIG. 8, with respect to the substrate, the size thereof is made large enough to manufacture the piezo-electric oscillator continuously in only one row, and one end portion of a lead frame 67 is coupled to each of the plurality of electrode patterns 64b, corresponding to the control terminal portions 64, after completion. The electrode pattern 64b formed in the other row on the substrate is coupled to each of the other end portion in this lead frame 67. In this way, a plurality of piezo-electric oscillators may be manufactured at one time, like the manufacturing method shown in FIG. 4 to FIG. 7.

Moreover, in the manufacturing method shown in FIG. 4 to FIG. 7, because the probe needs to be applied to the electrode pattern 64a at the time of writing the temperature compensation data, or the like, it is necessary to resin-cast using the resin mold in the surface of which the unevenness is formed so as not to apply the resin 66a in the cutoff region D2 of FIG. 7. A manufacturing method using a simple resin mold instead of using such a complicated resin mold will be described in detail hereinafter.

Figure 9A:
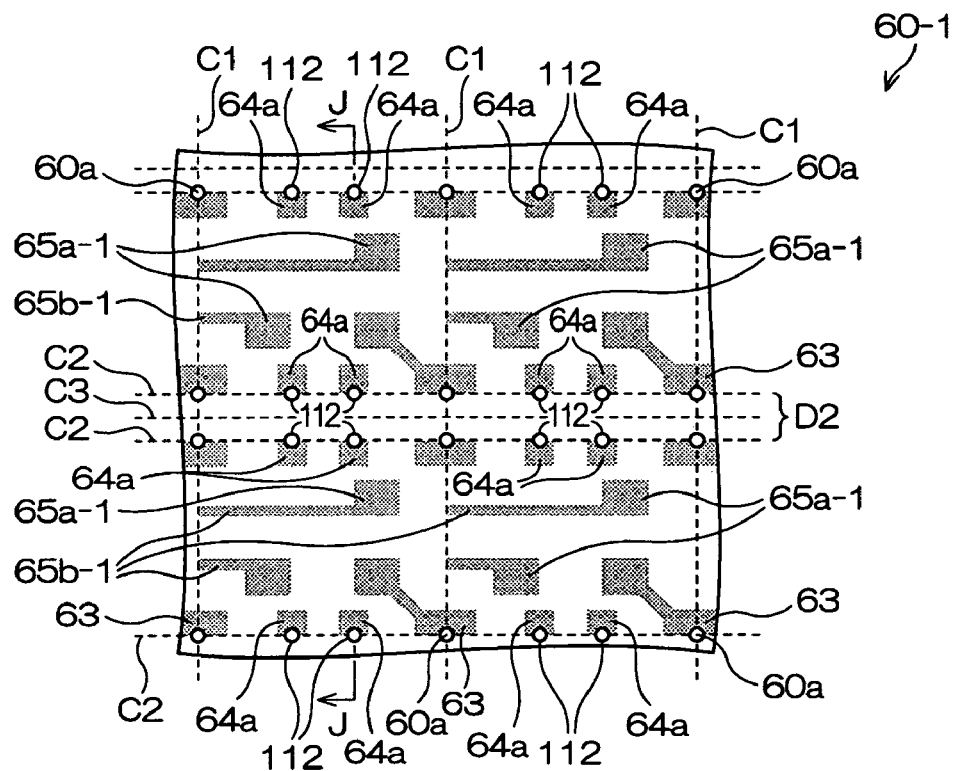
FIG. 9A is a schematic plane view at the side of a substrate in which a piezo-electric vibrator, an IC chip, or the like are mounted in an exemplary embodiment of the present invention.
Figure 9B:
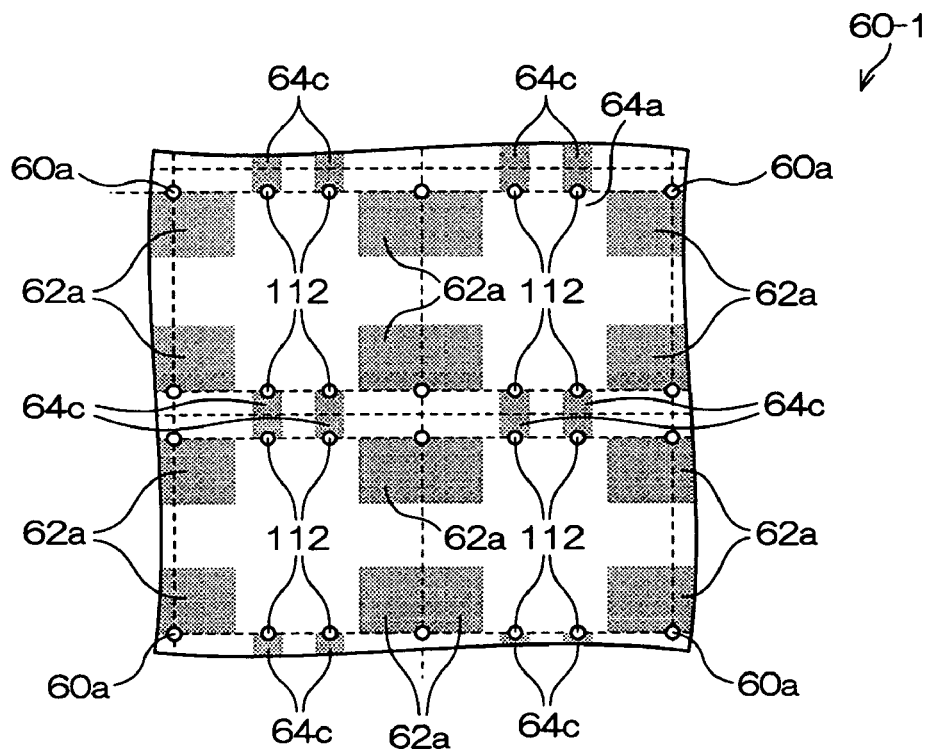
FIG. 9B is a schematic plane view at the side of the substrate in which a mounting terminal is formed in an exemplary embodiment of the present invention.

FIG. 9A is a plane view at the side of the substrate 60-1, in which, the piezo-electric vibrator and the IC chip, or the like are mounted, and FIG. 9B is a plane view at the side of the substrate 60-1, in which the mounting terminal is formed. Moreover, FIG. 10 is a schematic cross-sectional view in the case where the piezo-electric vibrator with an IC chip mounted is installed onto the substrate 60-1 of FIG. 9, then resin-molded, and is cut at the position of the line J-J of FIG. 9.

As shown in FIG. 9A, each electrode pattern 64a provided in the face of the substrate 60-1, which is to be resin molded, is not provided in the cutoff region D2. Then, each of these electrode patterns 64a is electrically coupled with each electrode pattern 64c formed in the mounting face side shown in FIG. 9B through each through-hole 112. Each of these electrode patterns 64c is formed in the cutoff region D2 so as not to be disposed at the portion 62a which becomes the mounting terminal after individualized (after completion).

The piezo-electric vibrator 35a with the IC chip 50a mounted thereon is installed to such a substrate 60-1, as shown in FIG. 10. Each IC chip 50a is electrically coupled with each electrode pattern 64a with a bonding wire 76. Then, after forming the resin 66a around the substrate 60-1, the individualization is carried out by cutting at the position of the cutting lines C1 and C3 shown in FIG. 9 and FIG. 10. The individualized piezo-electric oscillator with this cut off portion will be in the condition that the electrode pattern 64c, used for the writing of temperature compensation data or the like, is exposed to the outside at the side of the mounting face of the cutoff region D2, as shown in FIG. 10. Then, after writing the data for temperature compensation or the like, by contacting a probe or the like, to this electrode pattern 64c which is exposed to the outside, the substrate is cut off along each cutting line C2, and inspected to complete the piezo-electric oscillator.

According to such a manufacturing method, because the resin-sealed electrode pattern 64a is coupled with the electrode pattern 64c exposed to the outside at the side of the mounting face through the through-hole 112, the data for temperature compensation or the like can be written even if the whole surface at the side of the substrate 60-1 in which the piezo-electric vibrator is installed is resin-molded. Accordingly, the piezo-electric oscillator can be manufactured without using a complicated resin mold. Moreover, because the electrode pattern 64c used only in manufacturing is provided in the cutoff region D2, the writing can be carried out even if the mounting face of the piezo-electric oscillator is too small to have space for providing the electrode pattern in the mounting face. Then, because the electrode pattern 64c is cut off and will not exist after completion, a short-circuit between the mounting terminals due to the solder or the like used for mounting when mounting the piezo-electric oscillator to the mounting substrate is unlikely.

Because the piezo-electric oscillator 30 regarding the first exemplary embodiment of the present invention is constituted as described above, and because the IC chip 50 is installed at a upper face of the cover plate 32 of the piezo-electric vibrator 35 instead of putting together the piezo-electric vibration piece 37 and the IC chip 50 within the inner space S1 of the package, the manufacturing will be simple even if miniaturized, and the thermal influence due to the operation of the IC chip 50 will not be given on the piezo-electric vibration piece 37.

Furthermore, because the piezo-electric vibrator 35 is fixed to the upper face of the substrate 60 which has the connector terminal portion 65 adapted to correspond to the position of these external terminal portions 42 and 43, and this connector terminal portion 65 and the IC chip 50 are wire-bonded, the piezo-electric vibrator 35 can be coupled with the IC chip 50 without routing the electrode inside the package 36. Moreover, the substrate 60 has the mounting terminal portion 62 on the bottom face while having at the upper face the conduction terminal portions 63b and 63d electrically coupled with the mounting terminal portion 62, and these conduction terminal portions 63b and 63d are wire-bonded to the IC chip 50, respectively. Therefore, the mounting terminal portion 62 and the IC chip 50 are electrically coupled. Accordingly, the piezo-electric oscillator, with the mounting terminal portion 62, the IC chip 50, and the piezo-electric vibrator 35 being electrically coupled, can be manufactured using the general purpose piezo-electric vibrator 35.

Figure 11:
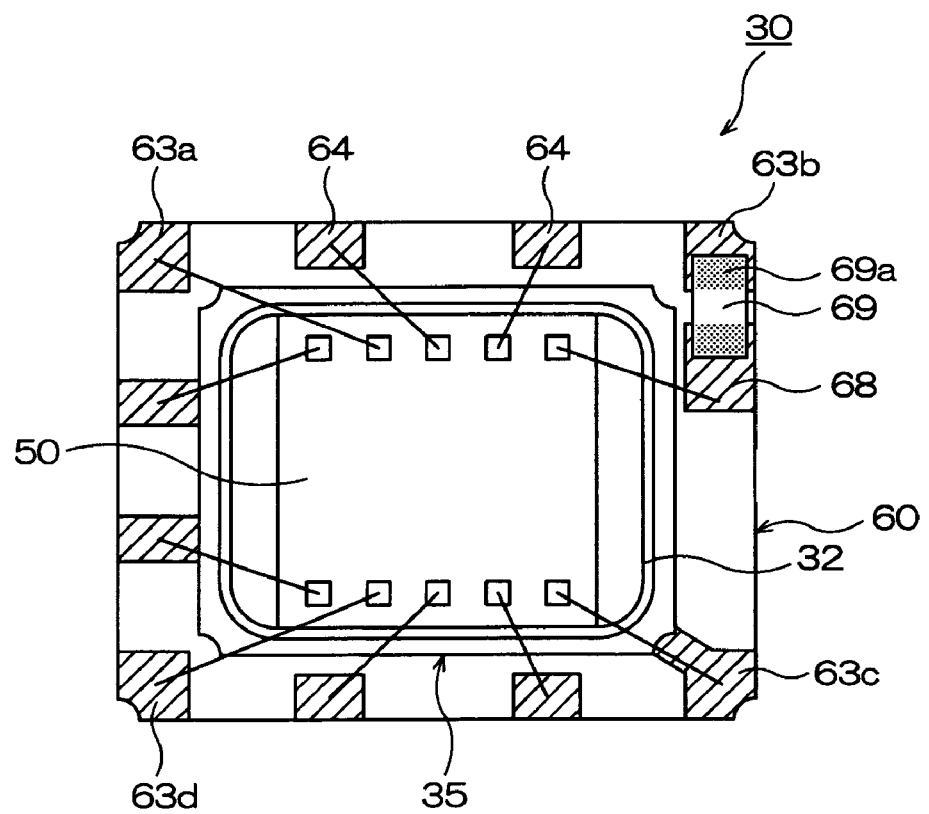
FIG. 11 is a schematic plane view of a modification of the first exemplary embodiment of the present invention.

Moreover, although in FIG. 1 to FIG. 7, one IC chip 50 is fixed to the upper face of the piezo-electric vibrator 35, electronic components other than the IC chip 50, for example, a capacitor or the like, may be mounted. In this case, as shown in FIG. 11, (a plane view of the piezo-electric oscillator, when seen through the resin,) a terminal portion 68 electrically coupled with the IC chip 50 by wire-bonding may be provided in the surface of the substrate 60. Thereby, even when an electronic component 69 can not be fixed to the upper face of the cover plate 32 of the piezo-electric vibrator 35, the electronic component 69 and the IC chip 50 can be electrically coupled if the electronic component 69 is coupled to the terminal portion 68. In addition, the terminal portion 68 of FIG. 11 is disposed so that the terminal 69a of the electronic components 69 may be coupled with the conduction terminal portion 63d.

Figure 12:
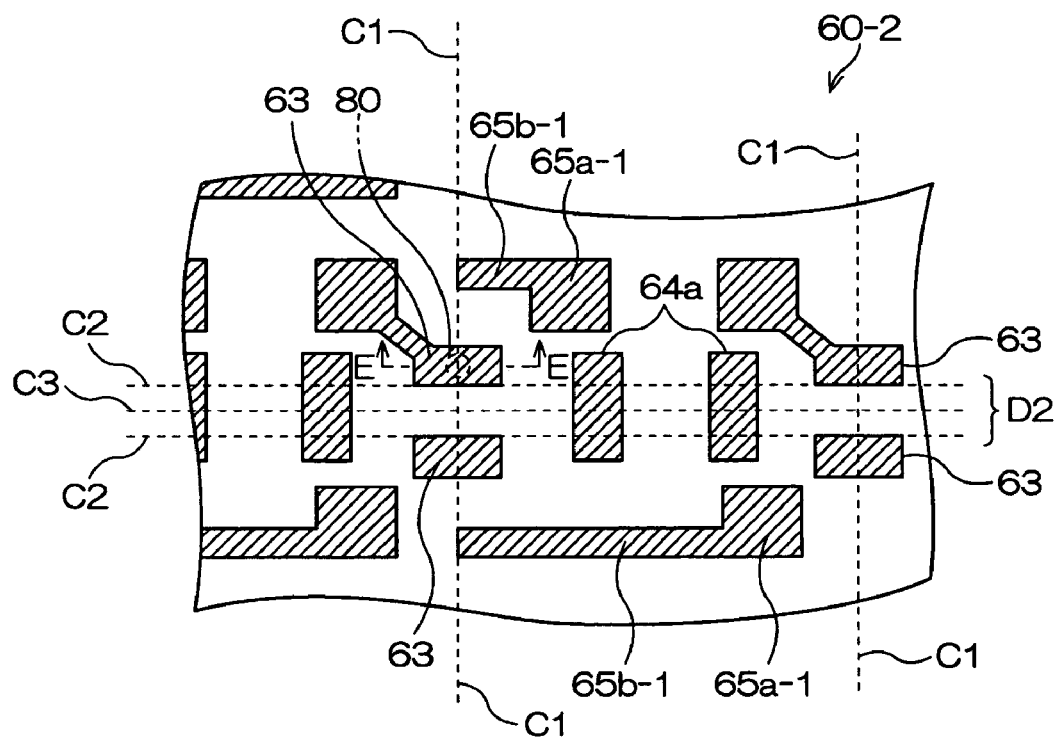
FIG. 12 is a schematic of a modification of the substrate of the method of manufacturing the piezo-electric oscillator illustrated in FIG. 5.
Figure 13:
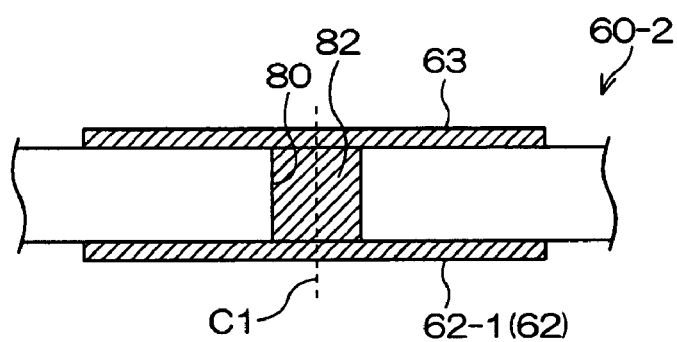
FIG. 13 is a schematic cross-sectional view cut along the E-E line of FIG. 12.

FIG. 12 and FIG. 13 show the piezo-electric oscillators of a first modification regarding the first exemplary embodiment of the present invention, and FIG. 12 shows a modification of the substrate which was described regarding the method of manufacturing the piezo-electric oscillator in FIG. 5, and FIG. 13 shows a cross-sectional view cut along line E-E of FIG. 12.

In these views, since the portions given the same numerals as those of the piezo-electric oscillator 30 of FIG. 1 to FIG. 11 are constituted in common, the duplicating description will be omitted, and hereinafter the description will be made focusing on the differences.

This modification of the piezo-electric oscillator concerning the first embodiment differs from the first embodiment mainly in the method of electrically coupling the mounting terminal portion 62 and the electrode pattern 63a to 63d after completion in the substrate formation process.

Namely, according to this exemplary modification, in the substrate formation process (Step 1-1 in FIG. 4), a plate-shaped substrate 60-2 in which a plurality of piezo-electric vibrators can be mounted is prepared, and in this substrate 60-2 a through-hole 80 made in a circular shape, or the like, is formed. This through-hole 80 is the hole for electrically coupling the mounting terminal portion 62 with the conduction terminal portion 63a though 63d after completion.

Specifically, in the region where the electrode pattern 63 corresponding to the conduction terminal portion 63a to 63d (refer to FIG. 1) after completion, and the electrode pattern 62-1 corresponding to the mounting terminal portion 62 (refer to FIG. 1) after completion are formed, the through-hole 80 is formed so as to cross the cutoff lines, C1, C1 and so on, at the time of cutting into the size corresponding to each piezo-electric oscillator.

Then, electrically conductive member 82 is filled inside the through-hole 80. The electrically conductive member 82 just has to be able to electrically couple the mounting terminal portion 62 with the conduction terminal portions 63a to 63d after completion, and has to be able to cover the through-hole 80. Here, considering the joining strength against the package 36, tungsten (W) is metalized, and nickel (nickel) and gold (Au) are plated on this surface so as to cover the through-hole 80.

Figure 14:
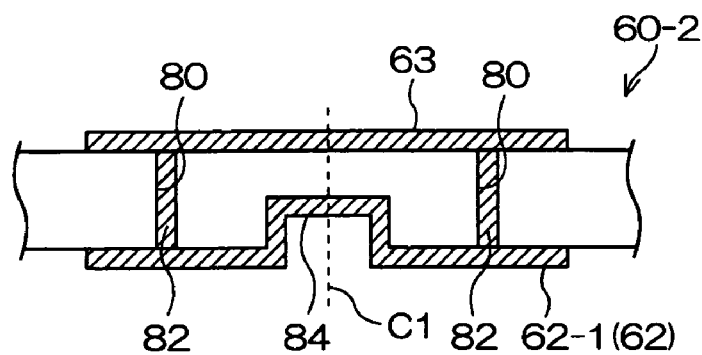
FIG. 14 is a schematic cross-sectional view concerning a modification of FIG. 13.

In addition, as shown in FIG. 14 which is a modification of FIG. 13, the through-hole 80 is not formed in the position of the cutting lines, C1, C1 and so on at the time of cutting into the size corresponding to each piezo-electric oscillator, but is formed in the position shifted from these cutting lines, C1, C1 and so on. Then, the hole 84 with a bottom is formed in the region where each electrode pattern 62-1 in the bottom face is to be disposed, and in the position of the cutting lines C1 and C1 at the time of cutting into the size corresponding to each piezo-electric oscillator, so that the hole with a bottom may be formed in a part of the mounting terminal portion 62 (refer to FIG. 1) after completion, and then the electrode formed together with the electrode pattern 62-1 is formed in the inner face of this hole 84 with the bottom.

The first exemplary modification concerning this first exemplary embodiment, as described above, exhibits the same operational effect as the first exemplary embodiment.

Moreover, because the electrically conductive member 82 is filled in the through-hole 80 for electrically coupling the mounting terminal portion 62 with the conduction terminal portions 63a to 63d after completion, the through-hole 80 will be in a condition of being covered with this electrically conductive member 82. For this reason, in the sealing process after the substrate formation process (Step 5 of FIG. 4), for example, when injecting the resin into the cavity of a metal mold, it is possible to prevent the resin from passing through the through-hole 80 to flow out from the upper face side to the bottom face side.

Furthermore, in FIG. 14, the position of the through-hole 80 is shifted from the cutting lines C1 and C1, and instead a hole 84 with a bottom is formed in the position of the cutting lines C1 and C1. Thereby, in one exemplary manufacturing process, the hole with a bottom is formed in a part of the plurality of mounting terminals 62, and when mounting the piezo-electric oscillator, solder or the like, which couples the mounting substrate and the mounting terminal 62, adheres to the inner face of this hole with a bottom to form a fillet, thus enabling the joining strength to be improved.

Figure 15:
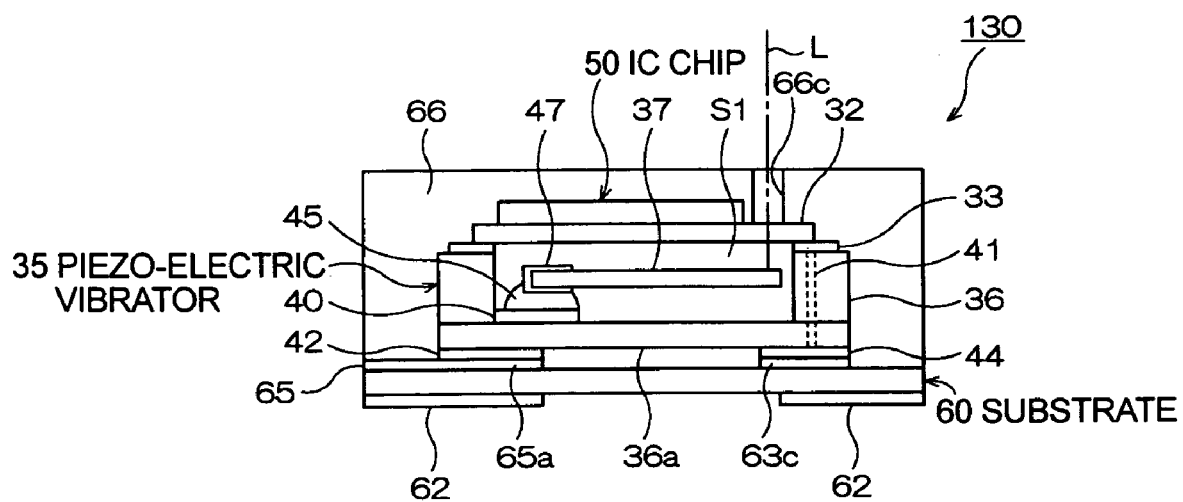
FIG. 15 is a schematic vertical sectional view illustrating a second modification of the piezo-electric oscillator in the first exemplary embodiment of the present invention.

FIG. 15 is a schematic vertical sectional view of a piezo-electric oscillator 130 of a second exemplary modification regarding the first exemplary embodiment of the present invention.

Since the portions given the same numerals as those of the piezo-electric oscillator 30 of FIG. 1 to FIG. 14 are the same, duplicating descriptions will be omitted, and hereinafter a description will focus on the differences.

The piezo-electric oscillator 130 regarding the second exemplary modification of the first exemplary embodiment differs from the first exemplary embodiment in that a hole used for frequency adjustment is provided in the resin.

Namely, the cover plate 32 made of material, such as glass transparent to light, is joined to the open end face of the package 36, of the piezo-electric vibrator 35, through the solder material 33, such as a low melting point glass.

Then, a linear shaped through-hole 66c is formed in the resin 66 so as to communicate between the surface of this cover plate 32 and the external space. Note that the IC chip 50 is disposed so as not to block the through-hole 66c.

The second exemplary modification concerning this first exemplary embodiment as described above, exhibits the same operational effect as the first exemplary embodiment. Furthermore, a laser beam L can be irradiated through the through-hole 66c to the excitation electrode, a weight or the like (not shown) on the piezo-electric vibration piece 37, after the resin molding. Accordingly, even when the piezo-electric vibration piece 37 receives stress, such as heat in the course of manufacturing, the frequency can be adjusted with high accuracy using a mass reduction method.

Figure 16:
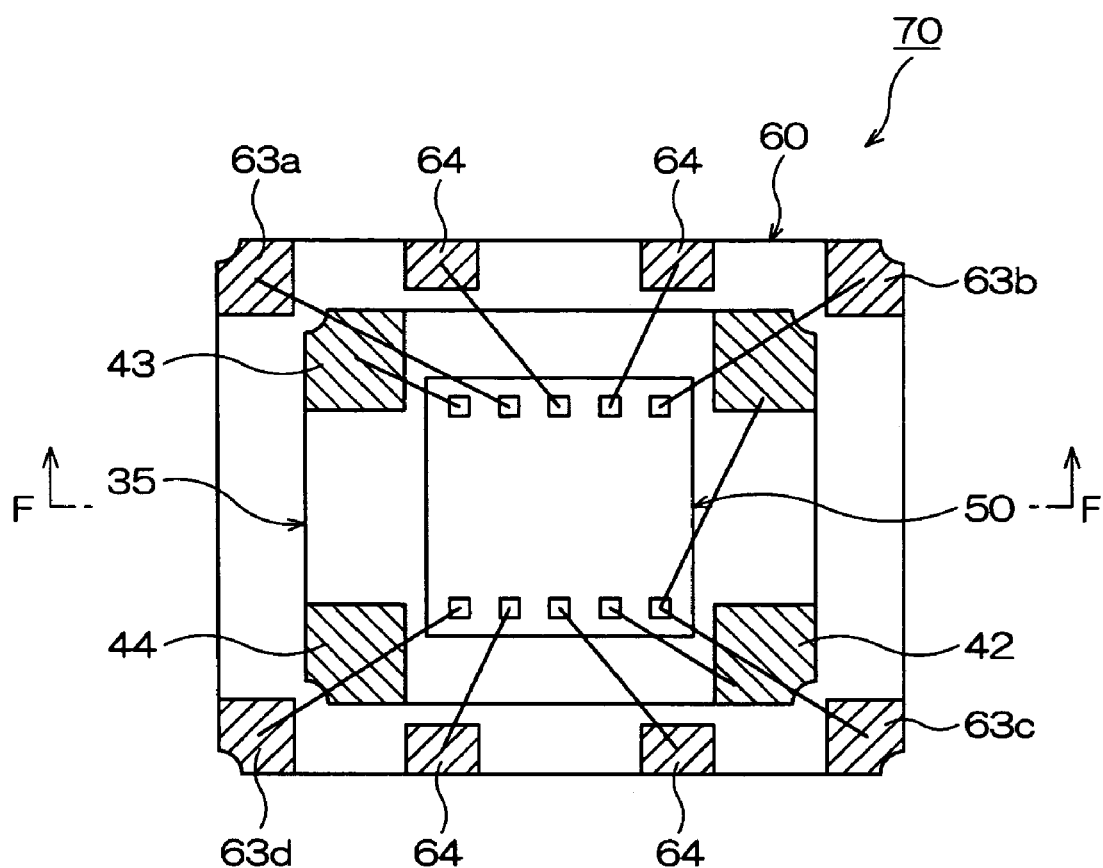
FIG. 16 is a schematic plane view in a second exemplary embodiment of the piezo-electric oscillator in a second exemplary embodiment of the present invention.
Figure 17:
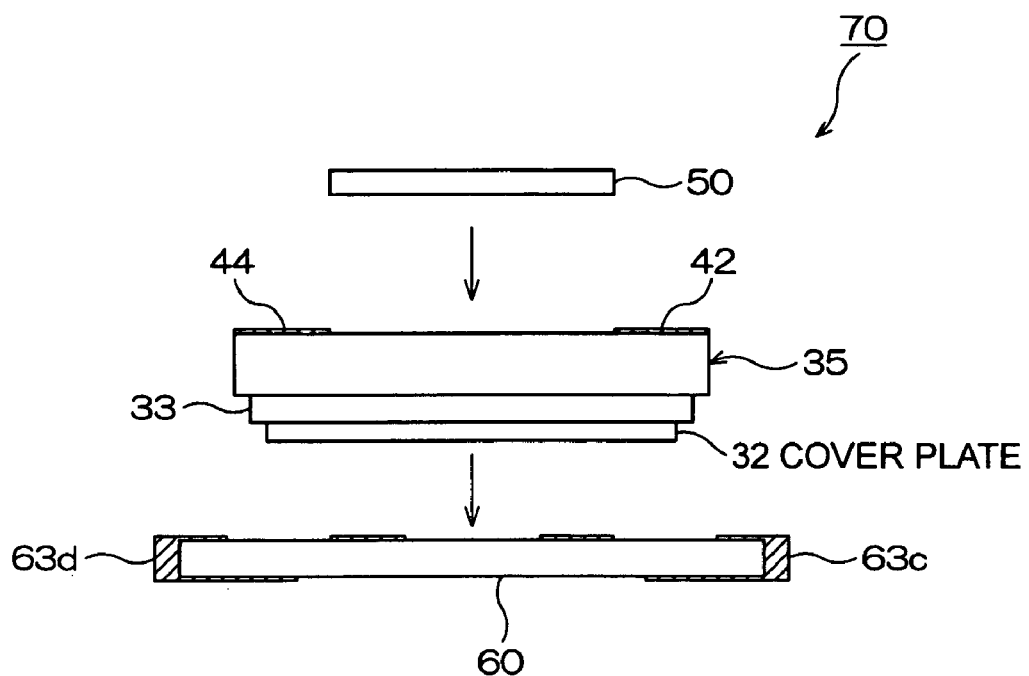
FIG. 17 illustrating a schematic exploded view illustrating the piezo-electric oscillator in a second exemplary embodiment of the present invention.

FIG. 16 and FIG. 17 show a second exemplary embodiment of the piezo-electric oscillator of the present invention, FIG. 16 is a schematic plane view thereof, and FIG. 17 is a schematic exploded view thereof. In addition, in FIG. 16 and FIG. 17, the resin 66 shown in FIG. 3 in the first exemplary embodiment is not shown for convenience of understanding.

In these views, since the portions given the same numerals as those of the piezo-electric oscillator 30 and 130 of FIG. 1 to FIG. 15 are the same, duplicating descriptions will be omitted, and hereinafter a description will focus on the differences.

A piezo-electric oscillator 70 concerning the second exemplary embodiment differs from the first exemplary embodiment mainly in that the piezo-electric vibrator 35 is turned upside down to couple-fix to the substrate 60.

Namely, although a general purpose product like the first exemplary embodiment is used for the piezo-electric vibrator 35, the piezo-electric vibrator 35 is couple-fixed such that the cover plate 32 may be opposed to the upper face of the substrate 60, as shown in FIG. 17.

Then, by coupling the cover plate 32 side to the substrate 60, the face where the external terminal portions 42 and 43 are provided is disposed to face upwards, and the IC chip 50 can be couple-fixed to the same face as the face in which these external terminal portions 42 and 43 are provided.

Moreover, since the IC chip 50 is fixed to the face in which the external terminal portions 42 and 43 are provided, the external terminal portions 42 and 43, as well as the IC chip 50 are wire-bonded in the same face as the piezo-electric vibrator 35.

The second exemplary embodiment of the present invention is constituted as described above, thus exhibiting the same operational effect as the first exemplary embodiment, and furthermore, the external terminal portions 42 and 43 can be directly wire-bonded to the IC chip 50 without providing the connection terminal portion 65 on the substrate 60 in the first exemplary embodiment. Moreover, because the external terminal portions 42 as well as 43, and the IC chip 50 are provided in the same face of the piezo-electric vibrator 35, the distance between the external terminal portions 42 as well as 43, and the IC chip 50 becomes shorter as compared with the first exemplary embodiment, and thus the length of the bonding wire can be shortened to reduce the floating capacitance as well.

Figure 18:
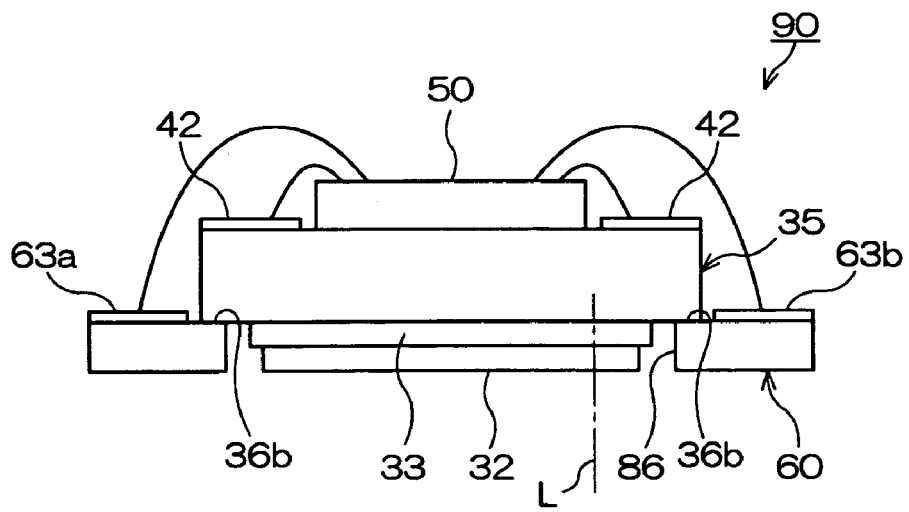
FIG. 18 is a schematic cross-sectional view illustrating a first modification of the second exemplary embodiment cut in the position of line F-F of FIG. 16 in an exemplary embodiment of the present invention.

FIG. 18 is a first exemplary modification of the second exemplary embodiment, and is a schematic cross-sectional cut in the position of line F-F of FIG. 16.

Since the portions given the same reference numerals as those of the piezo-electric oscillator 30, 70, 130 of FIG. 1 to FIG. 17 are the same, duplicating descriptions will be omitted, and hereinafter a description will focus on the differences.

In FIG. 18, a piezo-electric oscillator 90 concerning the first exemplary modification of the second exemplary embodiment differs from the second exemplary embodiment mainly in that in the substrate 60, a hole 86 is formed in the region opposed to the cover plate 32.

Namely, in FIG. 18, as for the piezo-electric vibrator 35, the cover plate 32 is not joined to the periphery of the open end face 36b of the package 36, but the cover plate 32 is joined so that a step may be formed in the open end face 36b side. Moreover, the substrate 60 has roughly the same as, or more than, the thickness of the cover plate 32 and the solder material 33.

Then, in FIG. 18, in the substrate 60, the hole 86 formed of a through-hole penetrating in the thickness direction is formed in the region opposed to the cover plate 32, and the cover plate 32 is inserted in the hole 86 so that the periphery of this hole 86 and the periphery of the open end face 36b of the package 36 may be joined.

In the first exemplary modification of the second exemplary embodiment, as described above, the cover plate 32 is inserted in the hole 86 of the substrate 60, thereby enabling the height of the piezo-electric oscillator 90 to be lowered by the amount of the thickness of the inserted cover plate 32. Moreover, the hole 86 also serves as a guide when mounting the piezo-electric vibrator 35 in the substrate 60.

Moreover, because in the exemplary modification of the second exemplary embodiment, the cover plate 32 is exposed to the outside, the laser beam L is, as shown in FIG. 18, is irradiated from the lower face of the product to transmits the cover plates 32, such as glass that transmit light, thus enabling the frequency to be adjusted using a mass reduction method. Accordingly, it is not necessary to provide the through-hole 66c in the resin 66, unlike the second exemplary modification of the first exemplary embodiment shown in FIG. 15.

Figure 19:
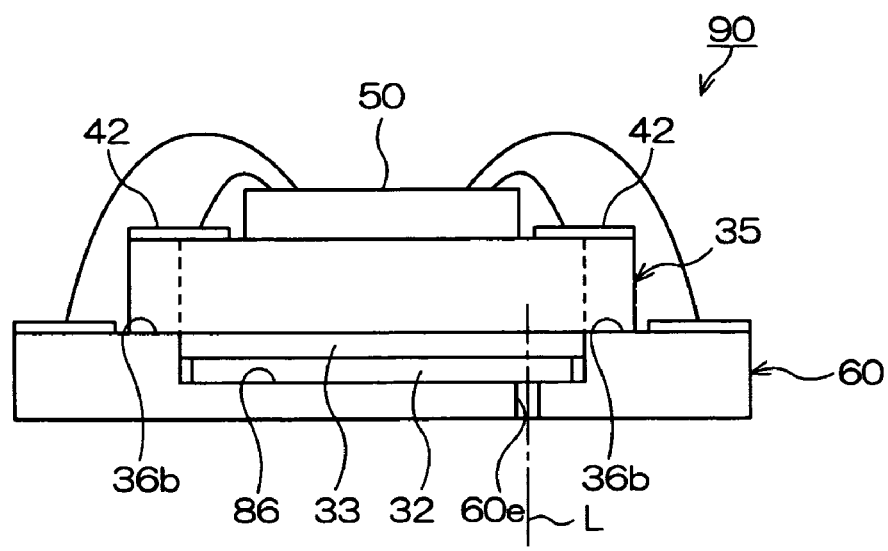
FIG. 19 is a schematic cross-sectional view illustrating a modification of FIG. 18 in an exemplary embodiment of the present invention.

In addition, although this hole 86 is made to be a through-hole in FIG. 18, even a hole with a bottom enables the height to be lowered as compared with the case where there is no holes, as shown in FIG. 19, which is a modification of FIG. 18. The hole also serves as a guide when mounting the piezo-electric vibrator 35. Then, for example, in the case where the periphery of the open end face 36b can not be joined to the substrate 60 due to the fact that the cover plate 32 is joined to the periphery of the open end face 36b of the package 60 (in the case where the position of the side wall of the package is located at the position of the dotted line of FIG. 19), the bottom face of the hole 86 with a bottom can be joined to the piezo-electric vibrator 35.

Moreover, in the case where the hole 86 of the substrate 60 is the hole with a bottom, a linear shaped through-hole 60e is provided in the substrate 60 as to communicate between the surface of the cover plate 32 and the external space, and the frequency may be adjusted by irradiating the laser beam L through this through-hole 60e to the excitation electrode, the weight, or the like on the piezo-electric vibration piece (not shown).

Figure 20:
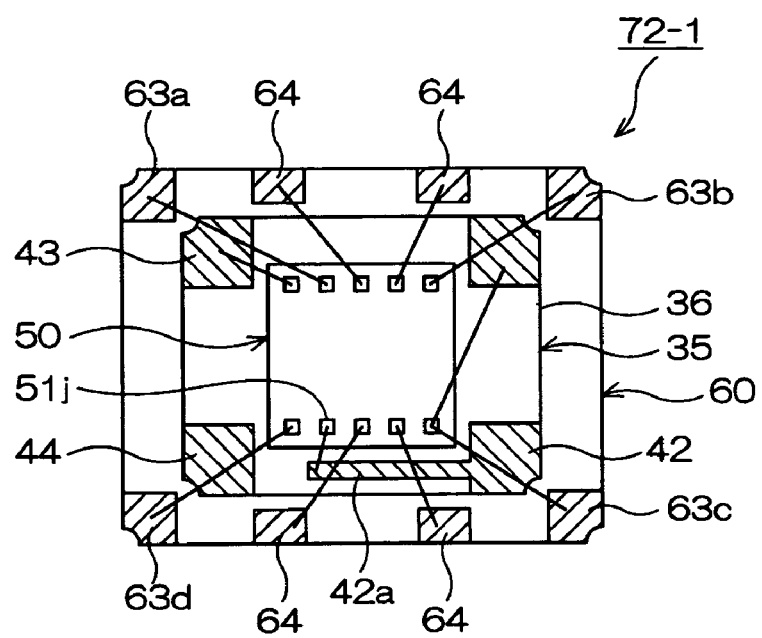
FIG. 20 is a schematic plane view illustrating a second modification of the second exemplary embodiment of the present invention.
Figure 21:
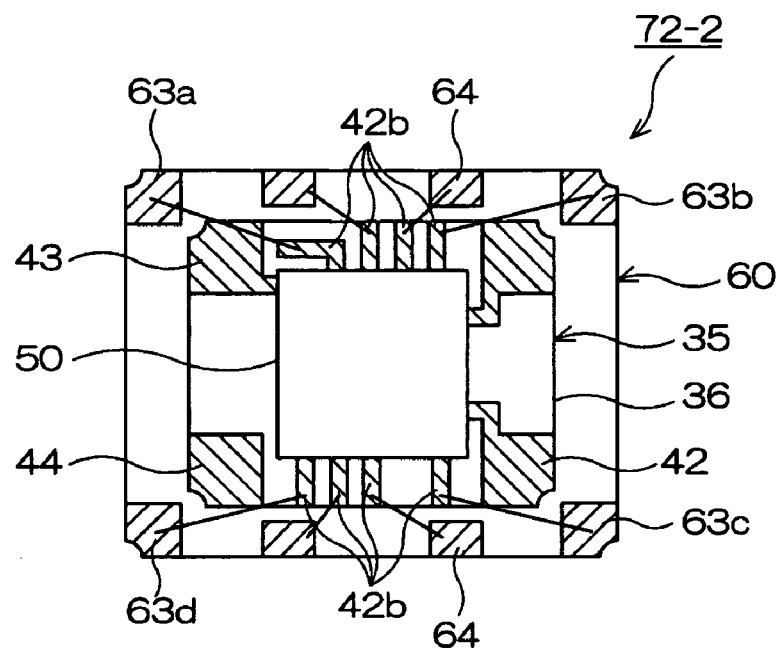
FIG. 21 is a schematic plane view illustrating a third modification of the second exemplary embodiment of the present invention.
Figure 22:
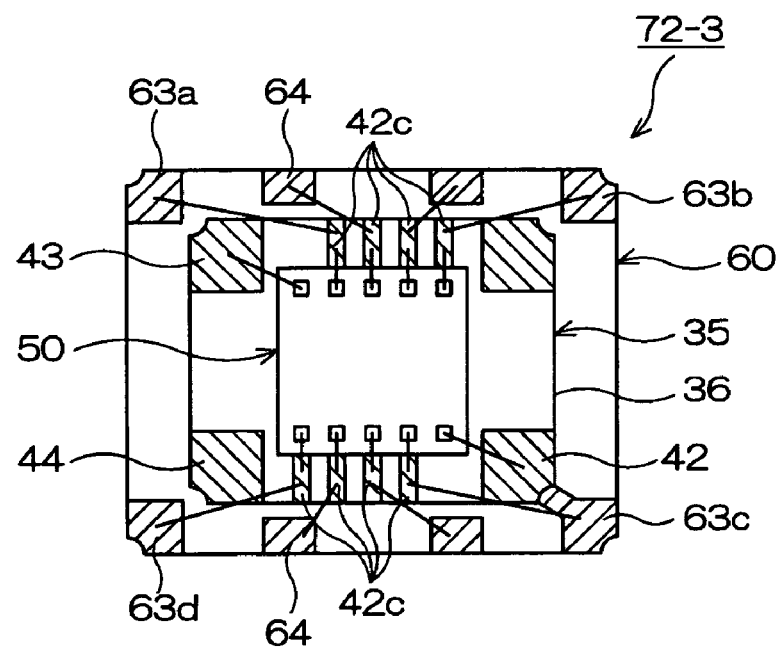
FIG. 22 is a schematic plane view illustrating a fourth modification of the second exemplary embodiment of the present invention.

FIG. 20 to FIG. 22 are schematic plane views regarding second to fourth exemplary modifications concerning the second exemplary embodiment of the present invention.

In these views, since the portions given the same numerals as those of the piezo-electric oscillators 30, 70, 90, 130 of FIG. 1 to FIG. 19 are the same, duplicating description will be omitted, and hereinafter the description will focus on the differences.

In FIG. 20 to FIG. 22, the piezo-electric oscillator concerning the second to fourth exemplary modifications differs from the second exemplary embodiment mainly in that in the surface of the piezo-electric vibrator another electrode pattern different from the external terminal portion is provided to wire-bond through this electrode pattern.

Namely, in the piezo-electric vibrator 35 in FIG. 20 to FIG. 22, there are provided the electrode patterns between the terminal portion of the IC chip 50, and the external terminal portions 42 as well as 43 and/or each of the terminals 63a to 63d and 64c on the upper face of the substrate to be electrically coupled with the terminal portion.

Specifically, in a piezo-electric oscillator 72-1 regarding a second exemplary modification of FIG. 20, there is provided an extension portion 42a coupled with the external terminal portion 42, and extended to near a terminal portion 51j of the IC chip 50 to be electrically coupled with this external terminal portion 42 in the face in which the external terminal portions 42 and 43 of the piezo-electric vibrator 35 are provided.

Moreover, in a piezo-electric oscillator 72-2 regarding a third exemplary modification of FIG. 21, a plurality of electrode patterns 42b corresponding to the position and count of the terminal portions (not shown) of the IC chip 50 is provided in the face in which the external terminal portions 42 and 43 of the piezo-electric vibrator 35 are provided, and the terminal portions of the IC chip 50 are flip-chip bonded onto these plurality of electrode patterns 42b. Then, each of the electrode patterns 42b is routed from the terminal portion of the IC chip 50 so as to come close to each terminal on the substrate 60 to which this terminal portion is to be electrically coupled.

Moreover, in a piezo-electric oscillator 72-3 regarding a fourth exemplary modification of FIG. 22, a plurality of electrode patterns 42c are formed in the face in which the external terminal portions 42 and 43 of the piezo-electric vibrator 35 are provided, these electrode patterns 42c each are wire-bonded to each terminal portion of the IC chip 50, respectively, and each of the electrode patterns 42c as well as each of the terminal portions of the IC chip 50 are electrically coupled respectively to each terminal on the substrate 60 by wire-bonding.

Figure 23:
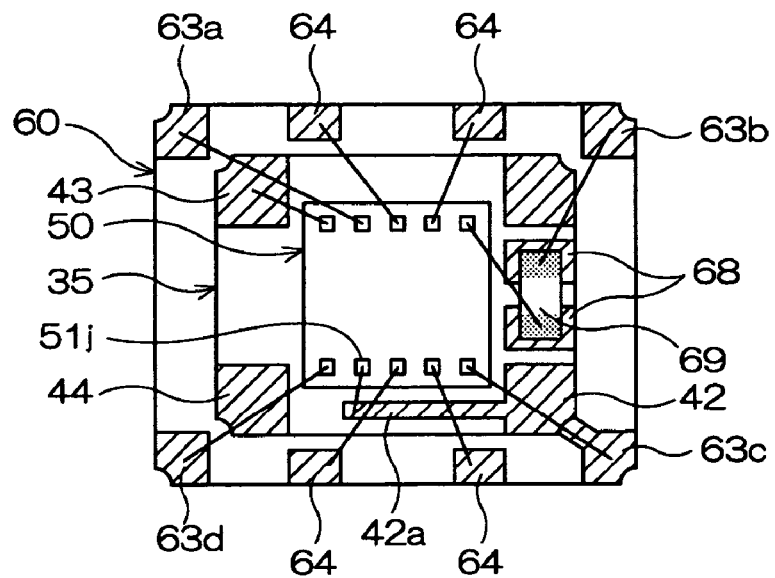
FIG. 23 is a schematic plane view illustrating a modification of the piezo-electric oscillator of FIG. 20 in an exemplary embodiment of the present invention.

In addition, in the piezo-electric oscillators 72-1 to 72-3 of FIG. 20 to FIG. 22, although only one IC chip 50 is couple-fixed to the piezo-electric vibrator 35, electronic components other than the IC chip 50 (for example, a capacitor or the like) may be mounted if necessary. In this case, for example, as shown in FIG. 23 which is a further modification of the piezo-electric oscillator 72-1 of FIG. 20, terminal portions 68 and 68 adapted to be electrically coupled with the IC chip 50 by wire-bonding may be provided in the surface of the piezo-electric vibrator 35. Thereby, if an electronic component 69 is coupled to the terminal portions 68 and 68, this electronic component 69 and the IC chip 50 can be electrically coupled. In addition, in FIG. 23, one of the terminal portions 68 and 68 is electrically coupled with the conduction terminal portion 63b by wire-bonding.

Moreover, by thicker plating each of the electrode patterns 42a, 42b, and 42c, as well as each of the terminals 42, 43, and 44 formed in FIG. 20 to FIG. 22, even if a paste-form adhesive flows out when coupling the IC chip 50 to the piezo-electric vibrator 35, the adhesive can be prevented from adhering to the surface of each electrode or each terminal. In addition, in this case, the flow of the adhesive may be controlled, for example, by forming a convex portion using a screen-printing in addition to or in place of each of the electrode patterns 42a, 42b, and 42c, or the like.

The second to fourth exemplary modifications concerning the second exemplary embodiment of the present invention are as described above. Accordingly, even in the case where the routing of the wire-bonding is difficult, for example, due to the disposition of the terminal portion of the IC chip 50 which is available to the market, because other electrode patterns 42a through 42c other than the external terminal portions 42 and 43 are provided in the surface of the piezo-electric vibrator 35, wire-bonding can be easily carried out using these electrode patterns 42a through 42c.

In addition, because in each of the modifications of the second exemplary embodiment the electrode patterns 42a through 42c are provided in the piezo-electric vibrator 35 itself, the form of this finished piezo-electric vibrator is not a general purpose product, strictly speaking. However, because the electrode patterns 42a-42c are provided in the surface of the piezo-electric vibrator 35, a general purpose product can be utilized if the electrode patterns 42a through 42c are formed in the surface of the general purpose piezo-electric vibrator 35 later on. Moreover, even in the case where the electrode patterns 42a through 42c are not formed in the surface of the general purpose piezo-electric vibrator 35 later on, because the electrode patterns 42a through 42c are not routed inside the package 36, as in the related art, the manufacturing cost will be less expensive as compared with the related art, and because miniaturization can be coped with, the same operational effect as the second exemplary embodiment can be obtained.

Figure 24:
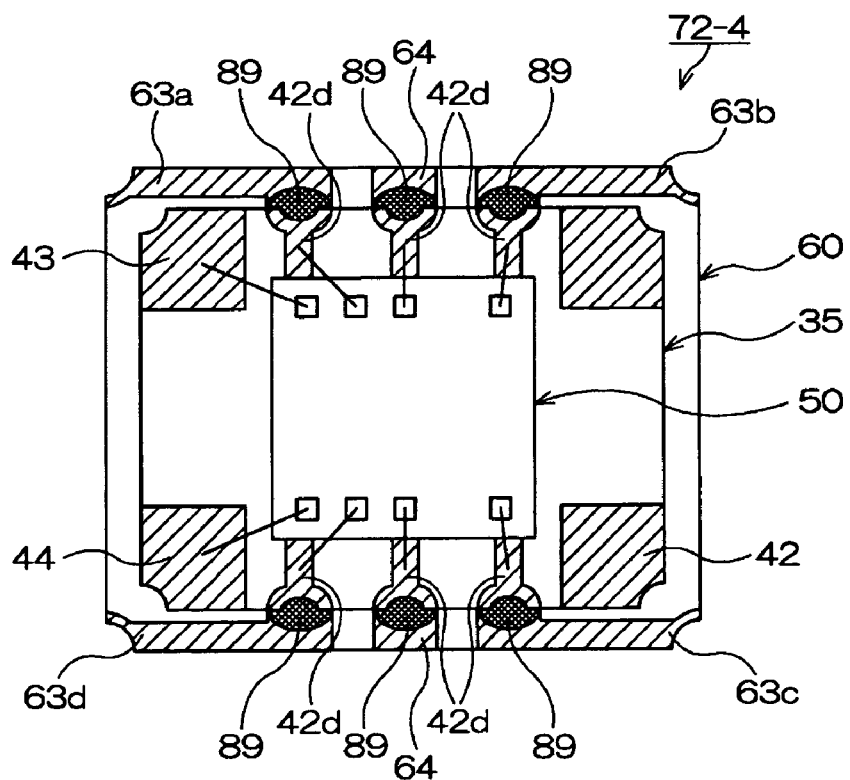
FIG. 24 is a schematic plane view illustrating a further modification of the third and fourth modifications on the second exemplary embodiment of the present invention.
Figure 25:
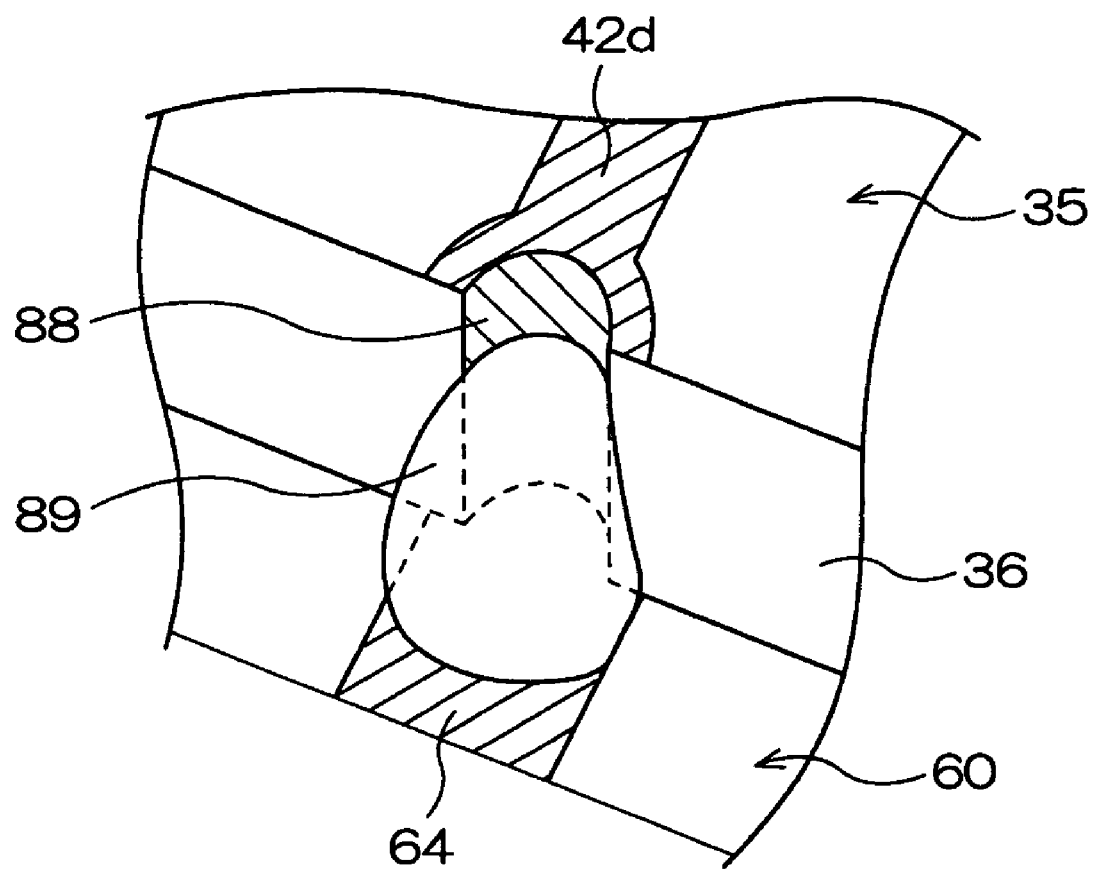
FIG. 25 is a perspective view illustrating an enlarged characteristic portion of FIG. 24.

FIG. 24 and FIG. 25 show a further exemplary modification of the fourth exemplary modification concerning the second exemplary embodiment of the present invention. FIG. 24 is a schematic plane view thereof, and FIG. 25 is an enlarged perspective view of the characteristic portion of FIG. 24.

In these views, since the portions given the same reference numerals as those of the piezo-electric oscillator 30, 70, 90, 72-3, 130 of FIG. 1 to FIG. 23 are the same, duplicating descriptions will be omitted, and hereinafter the description will focus on the differences.

In FIG. 24 and FIG. 25, a piezo-electric oscillator 72-4 differs from the fourth exemplary modification regarding the second exemplary embodiment mainly in the structure of the coupling between the electrode pattern provided in the surface of the piezo-electric vibrator 35 and each terminal on the upper face of the substrate.

Namely, in the piezo-electric oscillator 72-4, the electrode patterns 42d, 42d and so on are electrically coupled with the terminals 63a through 63d and 64 disposed near the end portion on the substrate through an electric conductor 88.

Specifically, like the piezo-electric oscillator 72-3 concerning FIG. 22, the plurality of electrode patterns 42d are provided between the terminal portion of the IC chip 50 and each of the terminals 63a through 63d and 64 on the upper face of the substrate which terminals are to be electrically coupled with this terminal portion of the IC chip 50, and these plurality of electrode patterns 42d and the terminal portion of the IC chip 50 are wire-bonded, respectively.

Then, as shown in FIG. 25, in the inner face of a quarter-round concave shaped castellation provided in the side of the piezo-electric vibrator 35, the piezo-electric oscillator 72-4 has an electric conductor 88 along the thickness direction, and this electric conductor 88 and the electrode pattern 42d are electrically coupled.

Moreover, in the substrate 60, the positions of the conduction terminal portions 63a through 63d and the control terminal portion 64 are formed as to align with the poison of each electric conductor 88, respectively, and these conduction terminal portions 63a through 63d and the control terminal portion 64 are coupled to each electric conductor 88 by an electrically conductive adhesive and solder 89, respectively.

The further modification of the fourth exemplary modification concerning the second exemplary embodiment of the present invention is as described above. For this reason, if wire-bonding each electrode pattern 42d to each terminal portion of the IC chip 50, respectively, then the terminal portion of the IC chip 50 will be electrically coupled with each of the terminals 63a through 63d and 64 on the substrate through each electrode pattern 42d and each electric conductor 88. Consequently, the space for routing the bonding wire between the piezo-electric vibrator 35 and the substrate 60 will be unnecessary, thus enabling the miniaturization of the piezo-electric oscillator 72-4.

Figure 26:
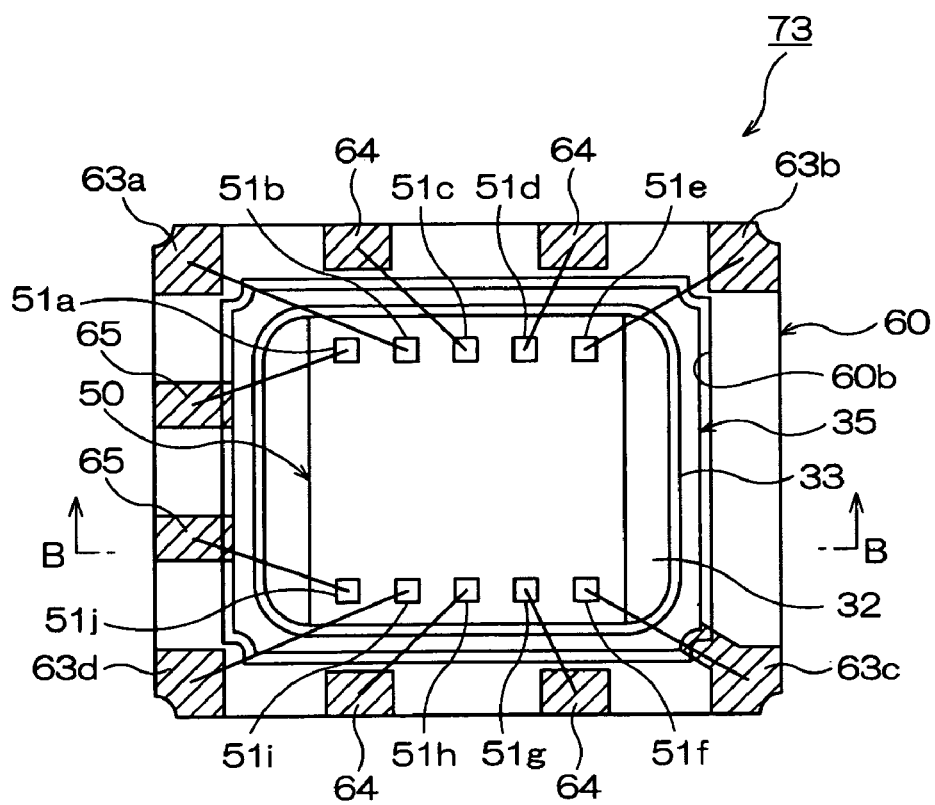
FIG. 26 is a schematic plane view embodiment of the piezo-electric oscillator in a third exemplary embodiment of the present invention.
Figure 27:
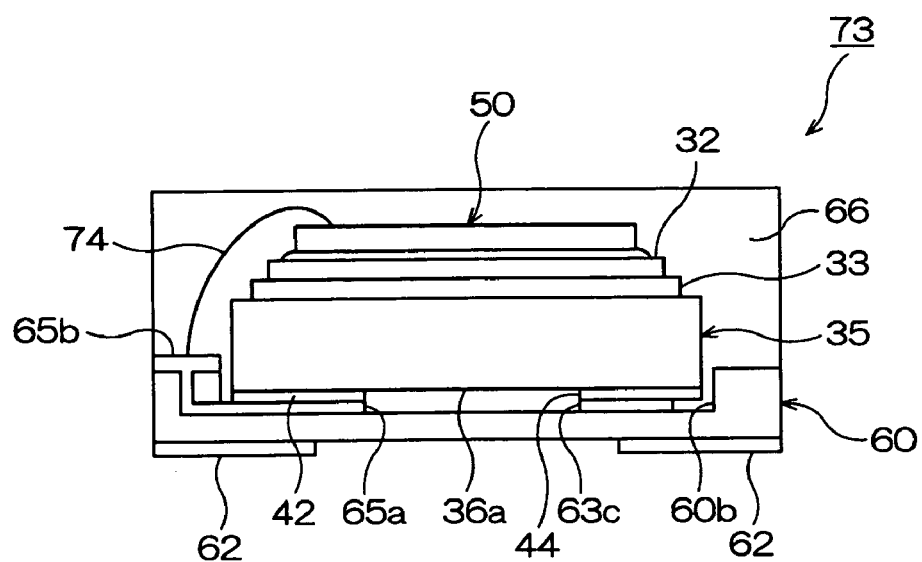
FIG. 27 is a schematic cross-sectional view cut along the line B-B of FIG. 26 in an exemplary embodiment of the present invention.

FIG. 26 and FIG. 27 show a third exemplary embodiment of the piezo-electric oscillator of the present invention, FIG. 26 is a schematic plane view thereof, and FIG. 27 is a schematic cross-sectional view cut along line B-B of FIG. 26. In addition, for convenience of understanding, the resin 66 described in each exemplary embodiment described above is not shown in FIG. 26, and a part of bonding wires is shown in FIG. 27.

In these views, since the portions given the same numerals as those of the piezo-electric oscillator 30 of FIG. 1 to FIG. 30 are the same, duplicating descriptions will be omitted, and hereinafter the description will focus on the differences.

A piezo-electric oscillator 73 concerning the third exemplary embodiment differs from the first exemplary embodiment mainly in that a concave shape is formed in the substrate 60.

Namely, the region, where the piezo-electric vibrator 35 is to be fixed in the substrate 60, is made to be in a concave shape 60b, and the periphery of the substrate 60 is formed as a bank which is one step higher than the concave shape 60b.

Then, in the position which is the bottom face of the concave shape 60b of the substrate 60, and is opposed to the external terminal portions 42 and 43 (refer to FIG. 1), a part 65a of the connection terminal portion 65 is provided, and this portion 65a is routed inside the substrate 60 to couple with the part 65b of the connection terminal portion 65 formed in the periphery one step higher than concave 60b.

Moreover, the control terminal portion 64 and the conduction terminal portions 63a through 63d are also disposed in the periphery one step higher than the concave shape 60b of the substrate 60.

The third exemplary embodiment of the present invention is as described above, thus exhibiting the same operational effect as the first exemplary embodiment. Furthermore, because the region of the substrate 60 where the piezo-electric vibrator 35 is fixed has a concave shape 60b, and this concave shape 60b serves as a guide when disposing the piezo-electric vibrator 35 in the substrate 60, the piezo-electric vibrator 35 can be disposed easily.

Moreover, because the part 65b of the connection terminal portion 65 to be coupled with the bonding wire 74 is disposed in the periphery one step higher than the bottom face of the concave shape 60b of the substrate, and the piezo-electric vibrator 35 is inserted in the concave shape 60b region, the part 65b of the connection terminal portion 65 will come closer to the IC chip 50 than the first exemplary embodiment. Consequently, because the distance of pulling down the bonding wire 74 becomes shorter, the wire-bonding will be easier.

Furthermore, the adhesive at the time of fixing the piezo-electric vibrator 35 to the substrate 60 can be prevented from flowing into the part 65b of the connection terminal portion, the control terminal portion 64, and the conduction terminal portions 63a through 63d, and thus poor coupling of the wire-bonding can be prevented.

Figure 28:
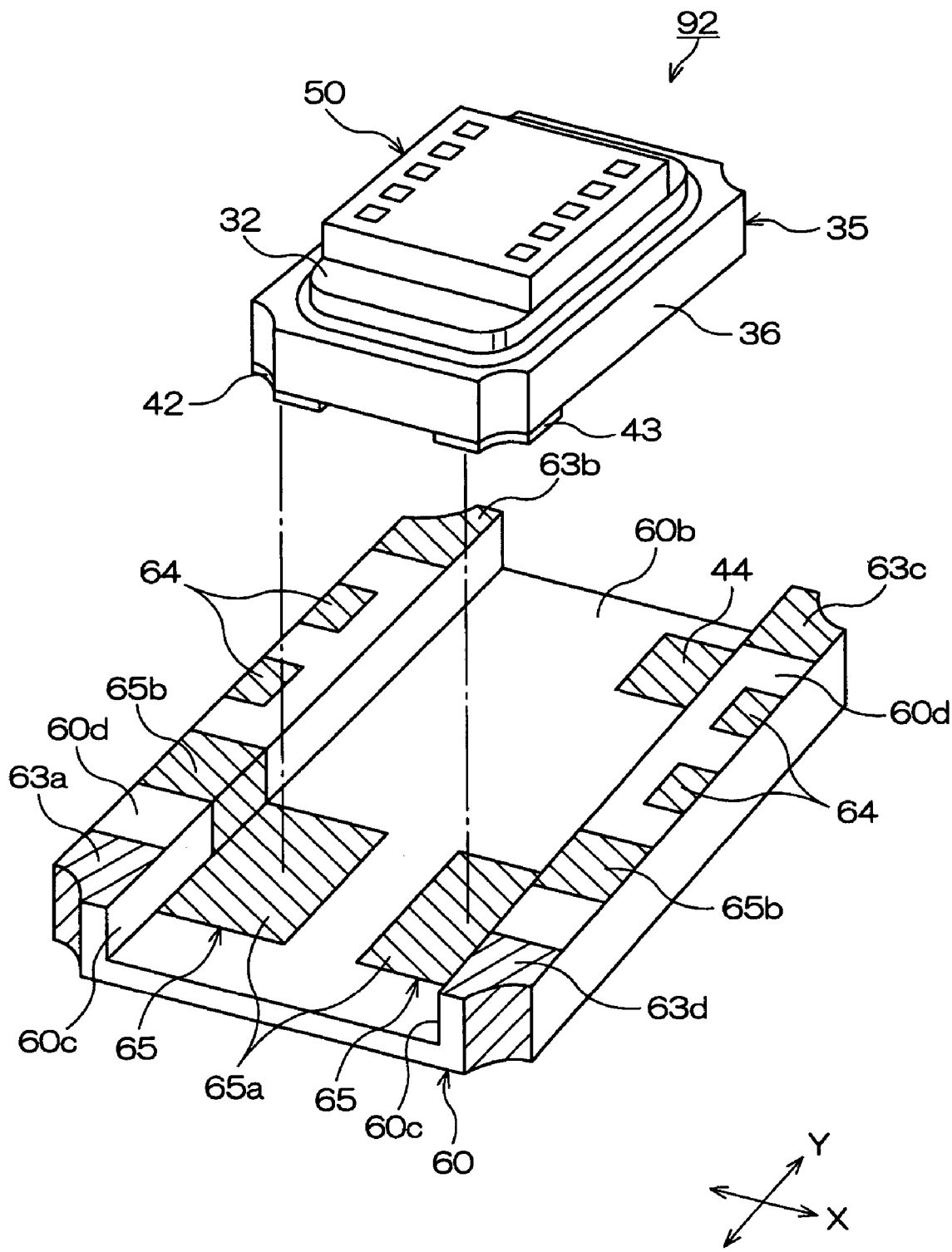
FIG. 28 is a schematic exploded perspective view illustrating a modification of the third exemplary embodiment of the present invention.

FIG. 28 is a schematic exploded perspective view concerning a first modification of the third exemplary embodiment of the present invention. Note that, in this view, for convenience of understanding, the resin and the bonding wire described in each of the above exemplary embodiments is not shown.

In this view, since the portions given the same reference numerals as those of the piezo-electric oscillator 30, 70, 90, 73, or the like of FIG. 1 to FIG. 14 are the same, the duplicating descriptions will be omitted, and hereinafter the description will focus on the differences.

A piezo-electric oscillator 92 concerning the first exemplary modification of the third exemplary embodiment differs from the third exemplary embodiment mainly in the shape of the concave portion provided at the substrate 60.

Namely, a part of the concave shape 60b is formed so as not to have a step, and regions opened horizontally (Y direction of FIG. 28), instead of being enclosed by the inner wall 60c, are formed.

Specifically, in the substrate 60 in FIG. 28, at least the region where the piezo-electric vibrator 35 is fixed is in the concave shape 60b, and two sides along the longer direction of the periphery (Y direction of FIG. 28) are made to be banks 60d and 60d one step higher than the bottom face of the concave shape 60b, and two sides along the shorter direction (X directions of FIG. 28) do not have a step, and the banks 60d and 60d do not exist.

Then, terminals to be wire-bonded, which are the portions 65b and 65b of the connection terminal portions 65 and 65, the conduction terminal portions 63a, 63b, 63c, and 63d, as well as the control terminal portion 64, are all disposed in the banks 60d and 60d, not in the bottom face of the concave shape 60b.

In addition, the portion of 65a and 65a of the connection terminal portions 65 and 65 formed in the position opposed to the external terminal portions 42 and 43 are extended to the inner walls 60c and 60c, respectively, to electrically couple with the portion of 65b and 65b which are provided in the banks 60d and 60d. Moreover, a dummy terminal 44 is also extended to the inner wall 60c to electrically couple with the conduction terminal portion 63c which is provided in the bank 60d.

The first exemplary modification of the third exemplary embodiment is as described above, thus exhibiting the same operational effect as the third exemplary embodiment. Moreover, the region opened horizontally (Y direction of FIG. 28), instead of being enclosed by the inner wall 60c, is formed in the substrate 60, and this open region can be effectively utilized as the mounting space for each electronic component. Accordingly, if the piezo-electric vibrator 35 is installed by shortening the length of the Y direction so that the portions of 65a and 65a of the connection terminal portions 65 and 65 of FIG. 28 may be disposed near the end portion, the piezo-electric oscillator 92 can be miniaturized in the Y direction as compared with the third exemplary embodiment. Moreover, other electronic components, such as a capacitor can be also mounted in this open region.

Figure 29:
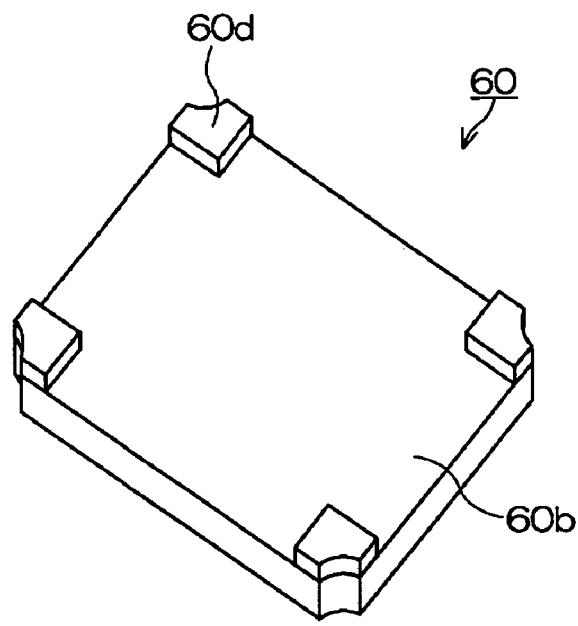
FIG. 29 is an example of a substrate of the modification of the third exemplary embodiment of the present invention.

In addition, although in FIG. 28, the substrate, two sides of which do not have a step, is formed in a concave shape, as long as the operational effect can be exhibited, this exemplary modification is not limited to this shape. For example, as shown in FIG. 29, the concave shape can be formed in the substrate, two or more sides of which do not have a step.

Figure 30:
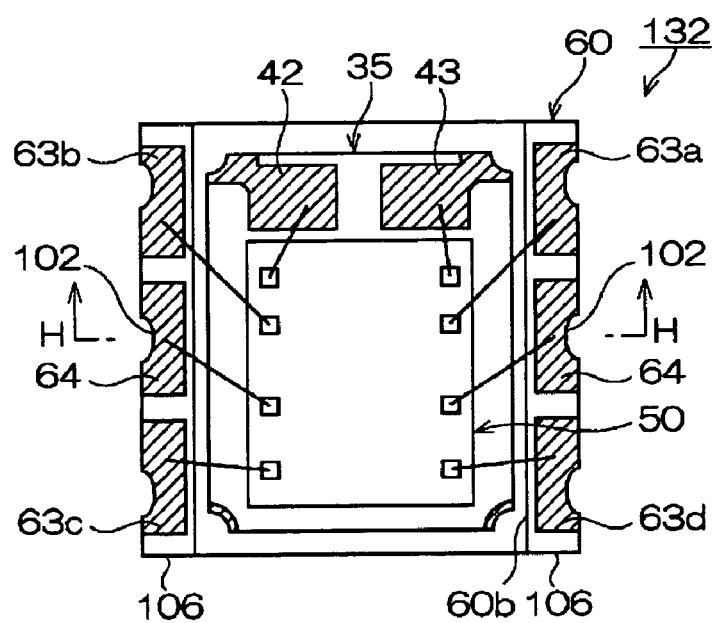
FIG. 30 is a schematic plane view of the piezo-electric oscillator of a second modification of the third exemplary embodiment of the present invention.
Figure 31:
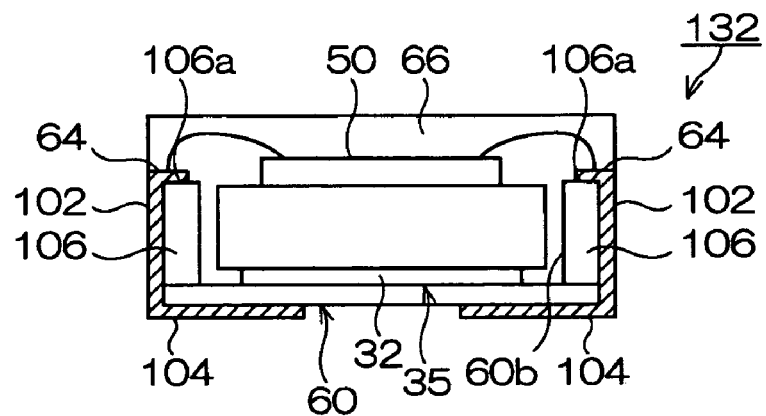
FIG. 31 is a cross-sectional view cut along the line H-H of FIG. 30 in an exemplary embodiment of the present invention.
Figure 32:
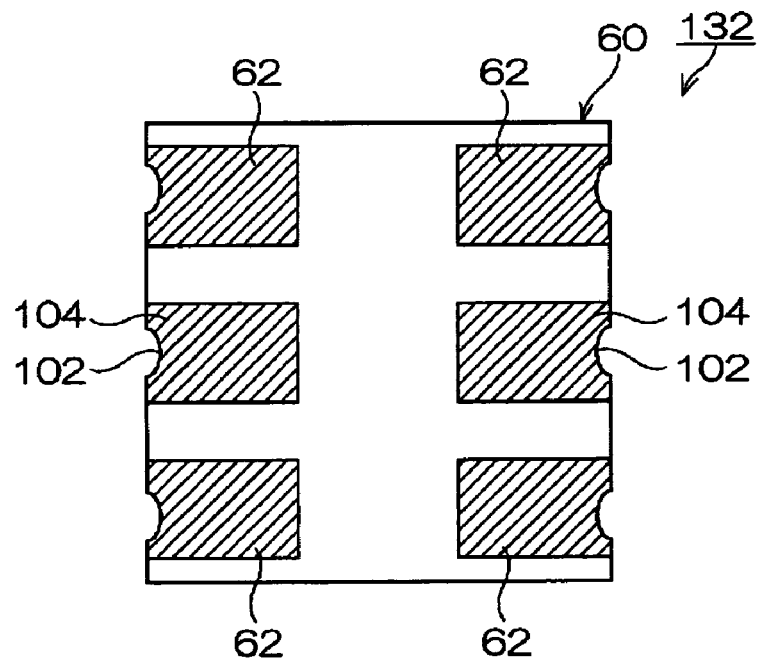
FIG. 32 is a schematic bottom plan view of the piezo-electric oscillator of the second modification of the third exemplary embodiment of the present invention.
Figure 33:
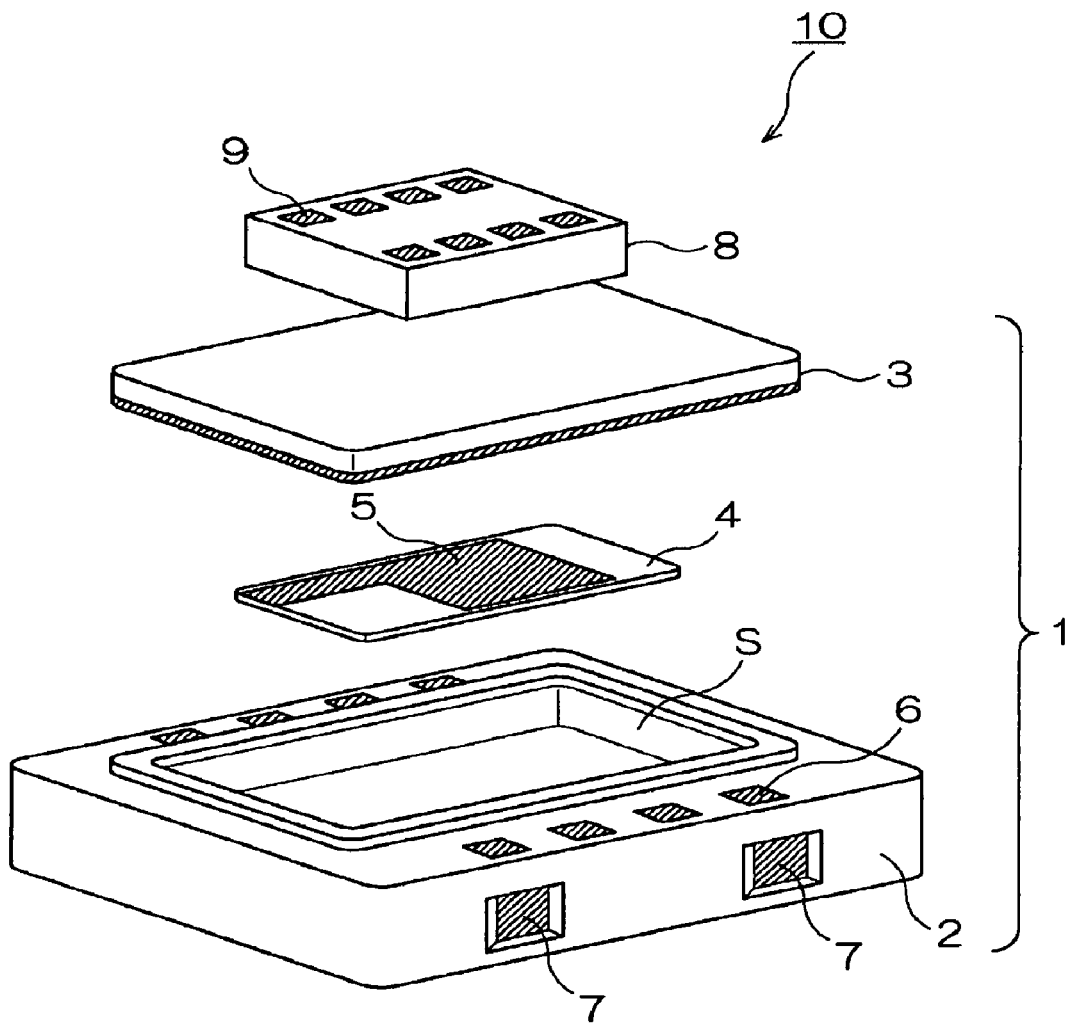
FIG. 33 is an exploded perspective view of a related art piezo-electric oscillator.

FIG. 30 to FIG. 32 show a piezo-electric oscillator 132 concerning a second exemplary modification of the third exemplary embodiment, FIG. 30 is a schematic plane view of the piezo-electric oscillator 132, FIG. 31 is a cross-sectional view cut along line H-H of FIG. 30, and FIG. 32 is a schematic bottom plan view of the piezo-electric oscillator 132. In addition, for convenience of understanding, this view is shown so that the inside of resin can be seen through by making the resin transparent. Moreover, some of the bonding wires explained in each exemplary embodiment described above are not shown.

In this view, since the portions given the same numerals as those of the piezo-electric oscillator 30, 70, 73, 90, 92 or the like of FIG. 1 to FIG. 29 are the same, duplicating descriptions will be omitted, and hereinafter the description will focus on the differences.

The piezo-electric oscillator 132 concerning the second exemplary modification differs from the third exemplary embodiment mainly in the disposition of the piezo-electric vibrator 35 and the IC chip 50, and in that the side wall portion is provided in the substrate 60.

Namely, regarding the disposition of the piezo-electric vibrator 35 and the IC chip 50, like the second exemplary embodiment, the piezo-electric vibrator 35 is couple-fixed to the substrate 60 so that the external terminal portions 42 and 43 may face upwards, and the cover plate 32 may be opposed to the upper face of the substrate 60. Then, the IC chip 50 is couple-fixed to the same face as the face in which these external terminal portions 42 and 43 are provided.

In the substrate 60, a pair of side wall portions 106 and 106 are provided in the upper face of a both ends of the shorter direction, and the region where the piezo-electric vibrator 35 is fixed is formed in the concave shape 60b. In this way, the substrate 60 does not have a step like the second exemplary modification of the third exemplary embodiment described above in the direction (the longer direction of FIG. 30) other than the direction (the shorter direction of FIG. 30) in which a pair of side wall portions 106 and 106 are provided, and regions opened toward the outside are formed instead.

Here, regarding the height direction (the vertical direction of FIG. 31) of the side wall portions 106 and 106, the position of the end faces 106a and 106a is roughly the same as that of the position of the terminal portion of the IC chip 50. Specifically, the position of the end face 106a of the side wall portion 106 is disposed between the height of the face in which the external terminal portions 42 and 43 of the piezo-electric vibrator 106 are provided, and the height of the face in which the terminal portion of the IC chip 50 is provided. In the case of the end face 106a of the side wall portion 106 of FIG. 31, the end face 106a is disposed so that the height thereof may be the same height as the face in which the external terminal portions 42 and 43 of the piezo-electric vibrator 106 are provided. Then, the conduction terminal portion 63b, the control terminal portions 64 and 64, or the like are provided in the end faces 106a and 106a of the height direction of these side wall portions 106 and 106, and each of these terminal portions is wire-bonded to the terminal portion of the IC chip 50 with a gold wire or the like.

Furthermore, the-writing terminals 104 and 104 electrically coupled with these control terminal portions 64 and 64 are formed in the bottom face of the substrate 60.

Specifically, in the bottom face of the substrate 60, only the mounting terminal portion 62 and the writing terminal 104 are disposed, wherein the mounting terminal portion 62 is disposed roughly in the four corners, and the writing terminal 104 is disposed near roughly the center portion of the longer direction. Then, this writing terminal 104 in the bottom face is coupled with the control terminal portion 64 on the end face 106a using the electric conduction pattern 102 in the groove along the height direction of the side (the side face of the side wall portion 106, and the side face of the substrate 60 in FIG. 31) of the substrate 60.

The second exemplary modification of the third exemplary embodiment of the present invention is the same as described above and therefore exhibits the same operational effect as the third exemplary embodiment and the first exemplary modification thereof. Furthermore, regarding the height direction of the side wall portion 106, the position of the end face 106a is made roughly the same as that of the position of the terminal portion of the IC chip 50, and the conduction terminal portion 63b, or the like, is disposed in the end face 106a to wire-bond to the terminal portion of the IC chip 50. Consequently, as compared with the third exemplary embodiment and the first exemplary modification thereof, the bonding wire can be shortened to also make the floating capacitance smaller.

Moreover, because the writing terminal 104 electrically coupled with the control terminal portion 64 is formed in the bottom face of the substrate 60 in which only the mounting terminal portion 62 is formed, and which thus has enough areas, the writing terminal 104 can be formed bigger. Accordingly, for example, the contact failure of the probing pin at the time of writing can be reduced to improve the yield.

This invention is not limited to the above-described exemplary embodiments. The configurations of the exemplary embodiments can be appropriately combined, omitted, or combined with other configurations (not shown).

What is claimed is:

1. A piezo-electric oscillator comprising:
resin;

a substrate having an upper face, a bottom face, a conduction terminal portion, and a mounting terminal portion at the bottom face, at least the conduction terminal portion being sealed with the resin;

a piezo-electric vibrator including a package a cover plate, a piezo-electric vibration piece, and an external terminal portion, the piezo-electric vibration piece being housed within the package, the package being fixed to the upper face of the substrate and sealed with the cover plate, the external terminal portion at a surface of the package being electrically coupled with the piezo-electric vibration piece; and an oscillation circuit element having an oscillation circuit, the oscillation circuit element being fixed to a face of the package opposite to the substrate, the conduction terminal portion on the upper face of the substrate being electrically coupled with the mounting terminal portion, and the external terminal portion and the conduction terminal portion being electrically coupled with the oscillation circuit element.

2. The piezo-electric oscillator according to claim 1, the piezo-electric vibrator being fixed to the substrate such that the external terminal portion faces the upper face of the substrate, the oscillation circuit element being fixed to an upper face of the cover plate of the piezo-electric vibrator, the substrate having a connection terminal portion formed in a position opposed to the external terminal portion and extended toward a periphery of the substrate from the position, the connection terminal portion and the conduction terminal portion respectively being coupled with the oscillation circuit element by wire-bonding.

3. The piezo-electric oscillator according to claim 1, the piezo-electric vibrator being fixed so that the cover plate is opposite the upper face of the substrate, and the oscillation circuit element being fixed to the face of the package to respectively couple with the external terminal portion and the conduction terminal portion by wire-bonding.

4. The piezo-electric oscillator according to claim 3, the substrate further having a hole formed in a region opposed to the cover plate.

5. The piezo-electric oscillator according to claim 1, the substrate having a control terminal portion for writing a signal in the oscillation circuit element to control operation of the piezo-electric vibration piece, the control terminal portion being on the upper face of the substrate, and the control terminal portion being coupled with the oscillation circuit element by wire-bonding.

6. The piezo-electric oscillator according to claim 5, a writing terminal electrically coupled with the control terminal portion being formed at the bottom face of the substrate.

7. The piezo-electric oscillator according to claim 1, an electrode pattern being provided at a surface of the piezo-electric vibrator, the electrode pattern being between one of a terminal portion of the oscillation circuit element and the conduction terminal portion, or the terminal portion of the oscillation circuit element and the external portion of the piezo-electric vibrator, the external terminal portion being electrically coupled with the terminal portion of the substrate.

8. The piezo-electric oscillator according to claim 7, the piezo-electric vibrator has at the surface thereof an electric conductor provided along the thickness direction, the electrode pattern provided between the terminal portion of the oscillation circuit element and the conduction terminal portion on the substrate being electrically coupled with the conduction terminal portion on the substrate through this electric conductor.

9. The piezo-electric oscillator according to claim 1, a region of the substrate to which the piezo-electric vibrator is fixed being in a concave shape.

10. The piezo-electric oscillator according to claim 9, a part of the concave shape being formed so as not to have a step.

11. The piezo-electric oscillator according to claim 9, the concave shape being formed by providing a pair of side wall portions in the substrate, and the position of an end face of the side wall portions being about the same in a height direction as the position of the terminal portion of the oscillation circuit element.

12. The piezo-electric oscillator according to claim 1, a terminal portion electrically coupled with the oscillation circuit element being provided at the surface of at least one of the substrate and the piezo-electric vibrator.

13. The piezo-electric oscillator according to claim 1, a hole with a bottom being formed in a part of the mounting terminal portion.

* * * * *